(12) United States Patent
Lee et al.

(10) Patent No.: US 9,640,513 B2
(45) Date of Patent: May 2, 2017

(54) SEMICONDUCTOR PACKAGE AND METHOD OF FABRICATING THE SAME

(71) Applicant: Samsung Electronics Co., Ltd., Suwon-si (KR)

(72) Inventors: Seokhyun Lee, Hwaseong-si (KR); Chul-Yong Jang, Suwon-si (KR); Jongho Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/682,113

(22) Filed: Apr. 9, 2015

(65) Prior Publication Data

US 2016/0005714 A1   Jan. 7, 2016

(30) Foreign Application Priority Data

Jul. 1, 2014   (KR) .................. 10-2014-0081963

(51) Int. Cl.
*H01L 25/00* (2006.01)
*H01L 25/065* (2006.01)
(Continued)

(52) U.S. Cl.
CPC .......... *H01L 25/0652* (2013.01); *H01L 23/13* (2013.01); *H01L 23/3107* (2013.01); *H01L 23/367* (2013.01); *H01L 25/0657* (2013.01); *H01L 25/105* (2013.01); *H01L 25/50* (2013.01); *H01L 21/565* (2013.01); *H01L 23/49816* (2013.01); *H01L 23/49838* (2013.01); *H01L 23/5385* (2013.01); *H01L 2224/04042* (2013.01); *H01L 2224/06135* (2013.01); *H01L 2224/16113* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01);
(Continued)

(58) Field of Classification Search
CPC ................................................ H01L 25/0652
See application file for complete search history.

(56) References Cited

U.S. PATENT DOCUMENTS 5,748,452 A   5/1998   Londa
6,320,250 B1   11/2001   Takahashi
(Continued)

FOREIGN PATENT DOCUMENTS

KR   10-2009-0123680 A   12/2009

*Primary Examiner* — William Harriston
(74) *Attorney, Agent, or Firm* — Muir Patent Law, PLLC

(57) ABSTRACT

Provided are a semiconductor package and a method of fabricating the same. The semiconductor package includes a first package having a first package substrate mounted with a lower semiconductor chip, and a second package having a second package substrate mounted with upper semiconductor chips. The second package substrate includes a chip region on which the upper semiconductor chips are mounted, and a connection region provided therearound. The chip region includes a first surface defining a first recess region and a second surface defining a first protruding portion. The upper semiconductor chips are mounted on opposite edges of the second surface and spaced apart from each other to have portions protruding toward the connection region beyond the chip region.

14 Claims, 22 Drawing Sheets

(51) Int. Cl.
  *H01L 23/31* (2006.01)
  *H01L 23/367* (2006.01)
  *H01L 25/10* (2006.01)
  *H01L 23/13* (2006.01)
  *H01L 21/56* (2006.01)
  *H01L 23/498* (2006.01)
  *H01L 23/538* (2006.01)

(52) U.S. Cl.
  CPC .............. *H01L 2224/73204* (2013.01); *H01L 2224/73253* (2013.01); *H01L 2224/73265* (2013.01); *H01L 2224/92125* (2013.01); *H01L 2225/0651* (2013.01); *H01L 2225/06565* (2013.01); *H01L 2225/06589* (2013.01); *H01L 2225/107* (2013.01); *H01L 2225/1023* (2013.01); *H01L 2225/1058* (2013.01); *H01L 2225/1088* (2013.01); *H01L 2225/1094* (2013.01); *H01L 2924/15159* (2013.01); *H01L 2924/15311* (2013.01); *H01L 2924/15331* (2013.01)

(56) References Cited

U.S. PATENT DOCUMENTS

| | | | |
|---|---|---|---|
| 6,472,732 B1 * | 10/2002 | Terui | H01L 23/13 257/678 |
| 6,743,696 B2 | 6/2004 | Jeung et al. | |
| 6,747,348 B2 | 6/2004 | Jeung et al. | |
| 6,787,894 B2 | 9/2004 | Jeung et al. | |
| 6,790,706 B2 | 9/2004 | Jeung et al. | |
| 7,217,994 B2 | 5/2007 | Zhu et al. | |
| 7,279,786 B2 | 10/2007 | Kim | |
| 7,285,847 B2 | 10/2007 | Lee | |
| 7,291,906 B2 | 11/2007 | Cha et al. | |
| 7,425,758 B2 | 9/2008 | Corisis et al. | |
| 7,605,459 B2 | 10/2009 | Mok et al. | |
| 7,723,159 B2 | 5/2010 | Do et al. | |
| 7,755,178 B2 | 7/2010 | Hagen et al. | |
| 7,777,351 B1 | 8/2010 | Berry et al. | |
| 7,838,334 B2 | 11/2010 | Yu et al. | |
| 7,875,983 B2 | 1/2011 | Yoo et al. | |
| 7,915,077 B2 | 3/2011 | Corisis et al. | |
| 7,977,780 B2 | 7/2011 | Tay et al. | |
| 7,982,298 B1 | 7/2011 | Kang et al. | |
| 8,125,092 B2 | 2/2012 | Corisis et al. | |
| 8,319,338 B1 | 11/2012 | Berry et al. | |
| 8,487,420 B1 | 7/2013 | Hwang et al. | |
| 8,558,365 B1 | 10/2013 | Roa et al. | |
| 8,872,319 B2 | 10/2014 | Kim et al. | |
| 2005/0006784 A1 * | 1/2005 | Nakayama | H01L 23/3114 257/777 |
| 2005/0104196 A1 | 5/2005 | Kashiwazaki | |
| 2006/0255449 A1 | 11/2006 | Lee et al. | |
| 2007/0196953 A1 * | 8/2007 | Fasano | H01L 25/0657 438/108 |
| 2008/0128882 A1 | 6/2008 | Baek et al. | |
| 2009/0309236 A1 | 12/2009 | Gerber | |
| 2010/0102458 A1 | 4/2010 | Chow et al. | |
| 2010/0171206 A1 | 7/2010 | Chu et al. | |
| 2012/0187578 A1 | 7/2012 | Li | |
| 2012/0212904 A1 | 8/2012 | Fleming et al. | |
| 2013/0297981 A1 | 11/2013 | Gu et al. | |

* cited by examiner

FIG. 12C
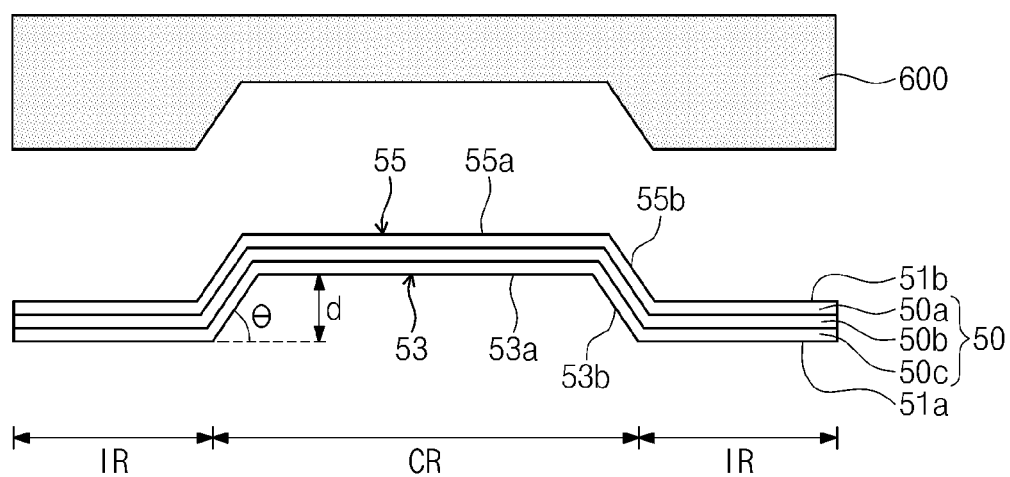
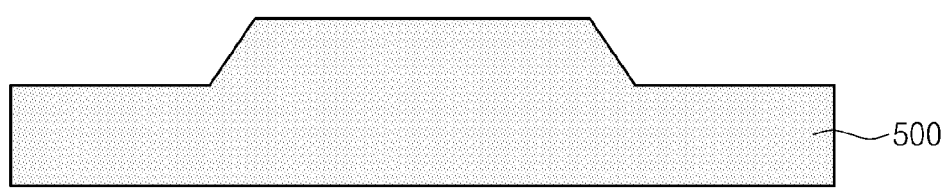

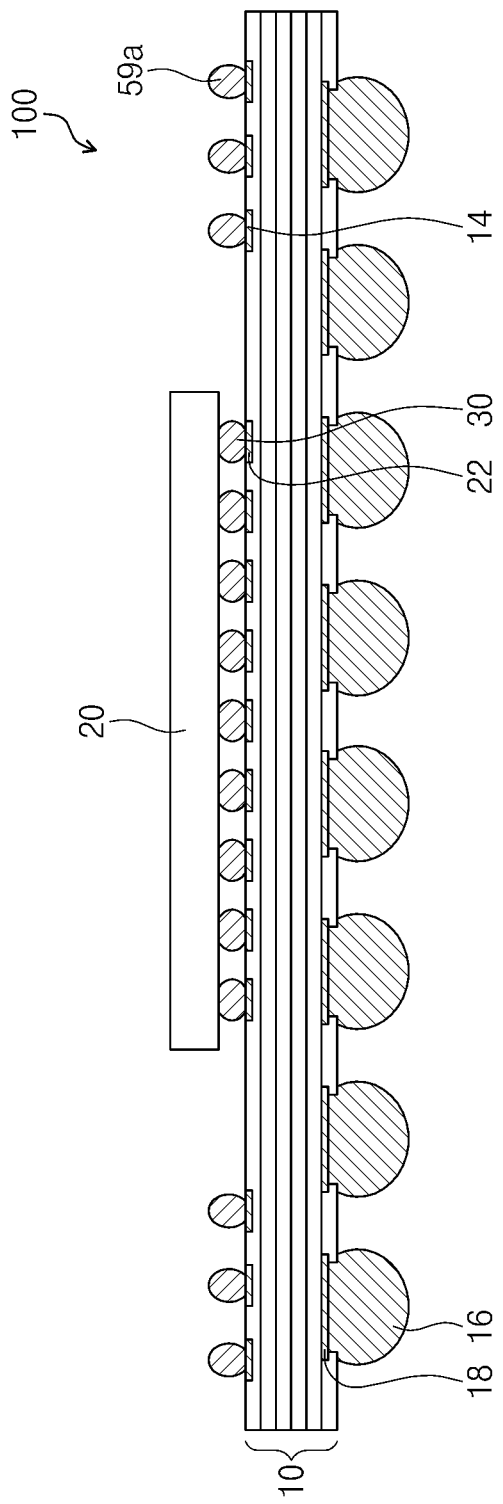

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2014-0081963, filed on Jul. 1, 2014, in the Korean Intellectual Property Office, the entire contents of which are hereby incorporated by reference.

BACKGROUND

Example embodiments of the disclosure relate to a semiconductor package and a method of fabricating the same, and in particular, to a package-on-package (PoP) type semiconductor package and a method of fabricating the same.

High-performance, high-speed and compact electronic systems are seeing increasing demand as the electronic industry matures. Various semiconductor package techniques have been proposed to meet such a demand. For example, a semiconductor package device may be configured to include a plurality of semiconductor chips mounted on a package substrate or to have a package-on-package (PoP) structure in which one package is stacked on the other package. Since each package of the PoP device has a semiconductor chip and a package substrate, the PoP device has a large thickness which may be undesirable in certain respects.

SUMMARY

Example embodiments of the inventive concept provide a semiconductor package, which is configured to realize a fine pitch of connecting elements of a PoP type package and increase an area for a wire bonding, and a method of fabricating the same.

According to example embodiments of the inventive concept, a semiconductor package may include a first package including a first package substrate on which a lower semiconductor chip is mounted, and a second package stacked on the first package. The second package may include a second package substrate on which upper semiconductor chips are mounted. The second package substrate may include a chip region overlapped with the lower semiconductor chip and providing a region on which the upper semiconductor chips are mounted, and a connection region disposed around the chip region. The chip region may include a first surface that faces the lower semiconductor chip and forms a first recess region, and a second surface that is opposite to the first surface and forms a first protruding portion. The upper semiconductor chips may be mounted on opposite edges of the second surface and spaced apart from each other to have portions protruding toward the connection region beyond the chip region.

In example embodiments, the lower semiconductor chip may be provided in such a way that an upper or entire portion thereof is inserted into the first recess region.

In example embodiments, the semiconductor package may further include bonding wires connecting the upper semiconductor chips electrically to the chip region of the second package substrate.

In example embodiments, the chip region of the second package substrate may include a center region positioned between the upper semiconductor chips, and the bonding wires may be provided on the center region.

In example embodiments, the semiconductor package may further include connecting elements connecting the connection region of the second package substrate electrically to the first package substrate.

In example embodiments, the semiconductor package may further include an interposer disposed between the first package and the second package.

In example embodiments, the semiconductor package may further include first connecting elements connecting the first package substrate electrically to the interposer, and second connecting elements connecting the connection region of the second package substrate electrically to the interposer. The first connecting elements may be provided on an edge region of the interposer that is overlapped with the connection region, when viewed in plan view.

In example embodiments, the interposer may include third and fourth surfaces that are opposite to each other. The third surface may be formed to face the lower semiconductor chip and define a second recess region on the chip region, and the fourth surface may be formed to have a second protruding portion.

In example embodiments, the semiconductor package may further include a mold layer provided to cover the fourth surface of the interposer and enclose the second connecting elements.

In example embodiments, the semiconductor package may further include a heat-transfer layer provided between the lower semiconductor chip and the first surface of the second package substrate.

In example embodiments, the second package substrate may be provided in such a way that the chip region protrudes toward a direction away from the lower semiconductor chip with respect to the connection region.

According to example embodiments of the inventive concept, a package-on-package type semiconductor package may include a second package stacked on a first package and may include a chip region and a connection region provided around the chip region. The first package may include a first package substrate, and a lower semiconductor chip mounted on the chip region of the first package substrate. The second package may include a second package substrate, and first and second upper semiconductor chips mounted on the chip region of the second package substrate. The chip region of the second package substrate may have bottom and top surfaces that are opposite to each other and have recessed and protruding shapes, respectively, in a direction away from the lower semiconductor chip.

In example embodiments, the first and second upper semiconductor chips may be mounted on the top surface of the chip region of the second package substrate, and the first and second upper semiconductor chips may be disposed to cross opposite edges of the chip region and protrude toward the connection region.

In example embodiments, the top surface of the chip region of the second package substrate may include a center region positioned between the first and second semiconductor chips. The semiconductor package may further include bonding wires disposed on the center region to connect the first and second upper semiconductor chips electrically to the second package substrate.

In example embodiments, the semiconductor package may further include connecting elements disposed between the connection regions of the first and second package substrates to connect the first package substrate electrically to the second package substrate.

According to example embodiments of the inventive concept, a method of fabricating a semiconductor package may include preparing a first package substrate on which a lower semiconductor chip is mounted, preparing a second package substrate on which first and second upper semiconductor chips are mounted, the second package substrate having first and second surfaces, which are opposite to each other and define a recess region and a protruding portion, respectively, and having a chip region overlapped with the lower semiconductor chip and a connection region adjacent to the chip region, and mounting the second package substrate on the first package substrate in such a way that the lower semiconductor chip faces the recess region. The first and second upper semiconductor chips may be disposed to cross the chip region and protrude toward the connection region.

In example embodiments, the preparing of the first package substrate may include disposing the lower semiconductor chip on the first package substrate, and forming an under-fill resin layer to fill a space between the lower semiconductor chip and the first package substrate.

In example embodiments, the preparing of the second package substrate may include preparing a first mold having a protruding central region and a second mold having a recessed central region, disposing the second package substrate between the first and second molds, applying pressure to the second package substrate through the first and second molds, separating the second package substrate from the first and second molds, mounting the first and second upper semiconductor chips on the second package substrate, and forming a mold layer on the second package substrate.

In example embodiments, the preparing of the second package substrate may include mounting the first and second upper semiconductor chip on the second package substrate, preparing a first mold having a protruding central region and a second mold having a recessed central region, disposing the second package substrate between the first and second molds, supplying a molding resin between a space between the second package substrate and the second mold, and applying pressure to the second package substrate through the first and second molds.

In example embodiments, the second package substrate may include a first insulating layer, a core layer, and a second insulating layer stacked sequentially.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 12A through 12C are sectional views illustrating a method of fabricating an upper package substrate according to example embodiments of the inventive concept.

FIGS. 14A through 14C are sectional views illustrating a method of fabricating a semiconductor package according to example embodiments of the inventive concept.

Figure 1:
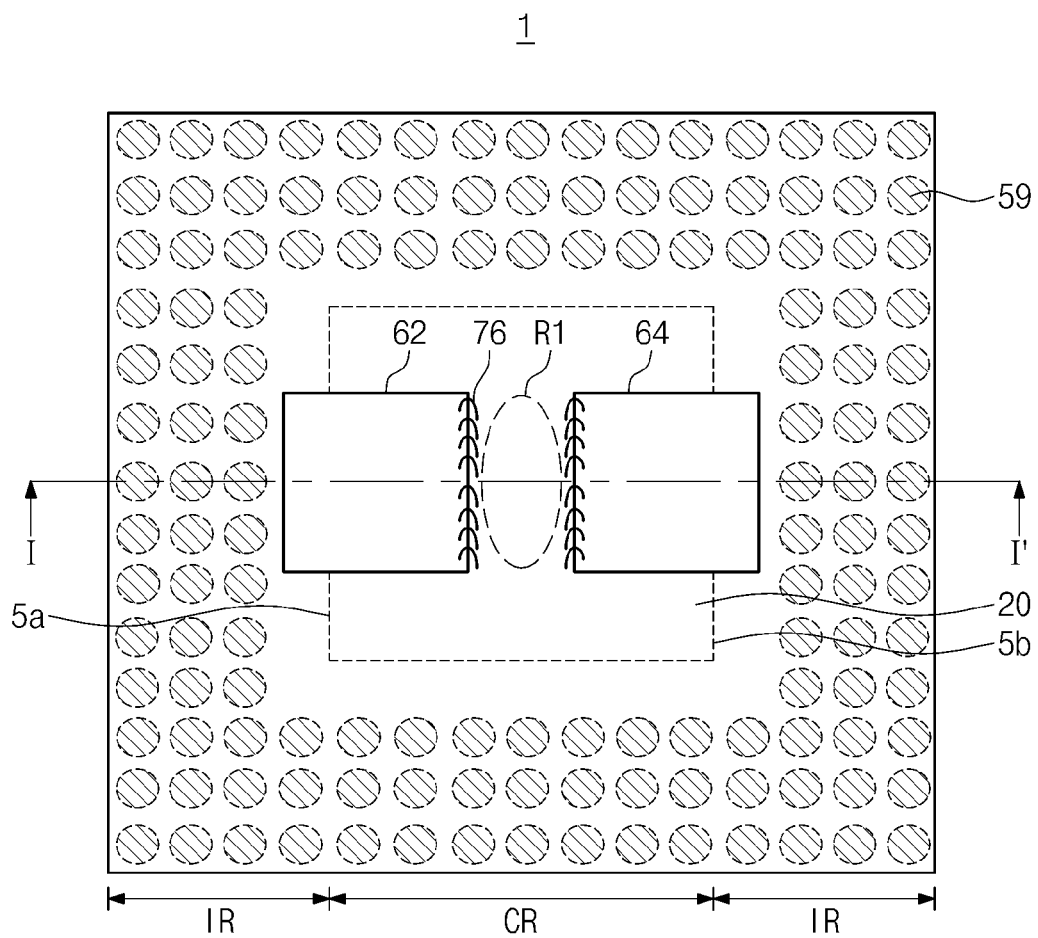
FIG. 1 is a plan view illustrating a semiconductor package according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as contacting another element, there are no intervening elements present. Other words used to describe the relationship between elements or layers should be interpreted in a like fashion (e.g., "between" versus "directly between," "adjacent" versus "directly adjacent," "on" versus "directly on").

As used herein the term "and/or" includes any and all combinations of one or more of the associated listed items. It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
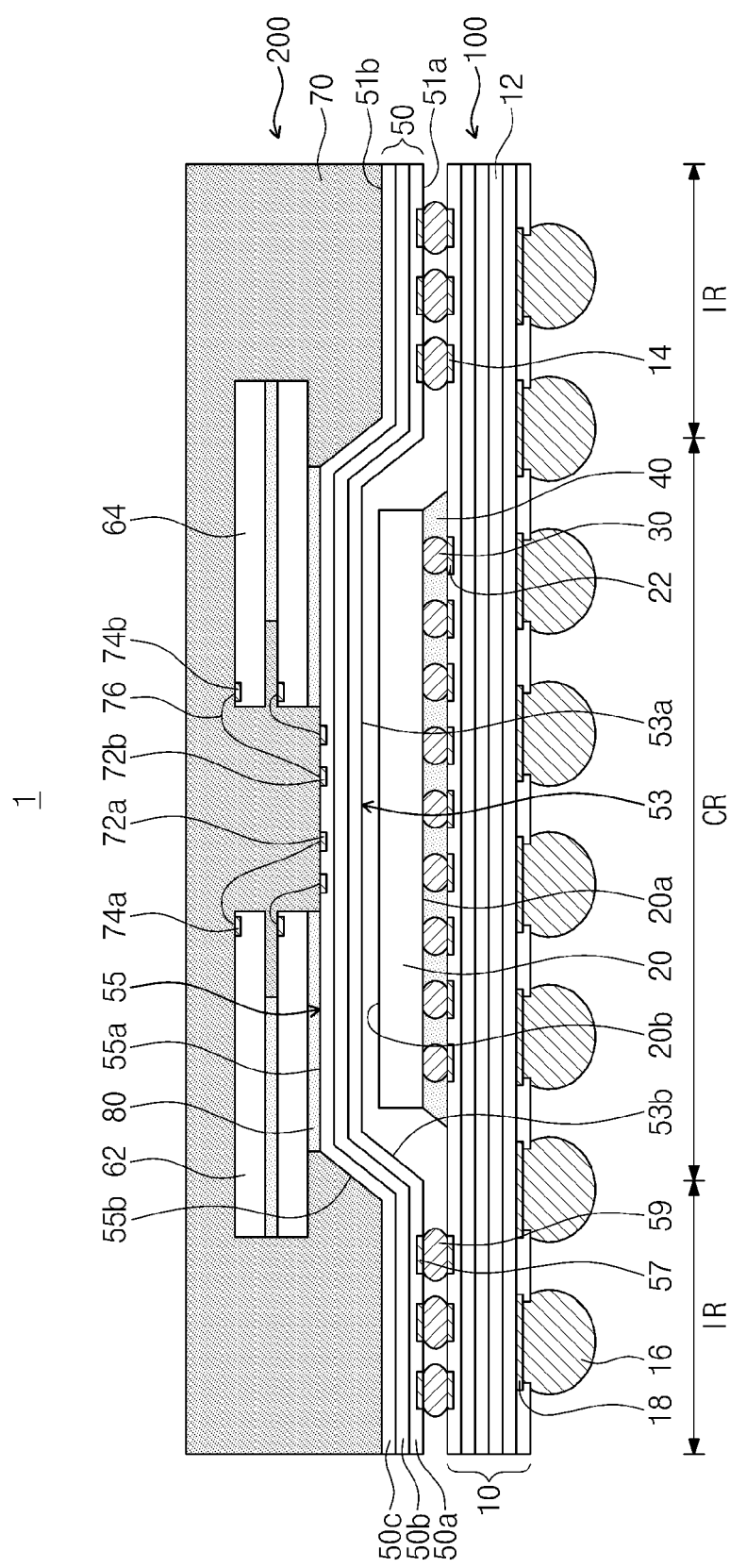
FIG. 2 is an exemplary sectional view taken along a line I-I' of FIG. 1.
Figure 3:
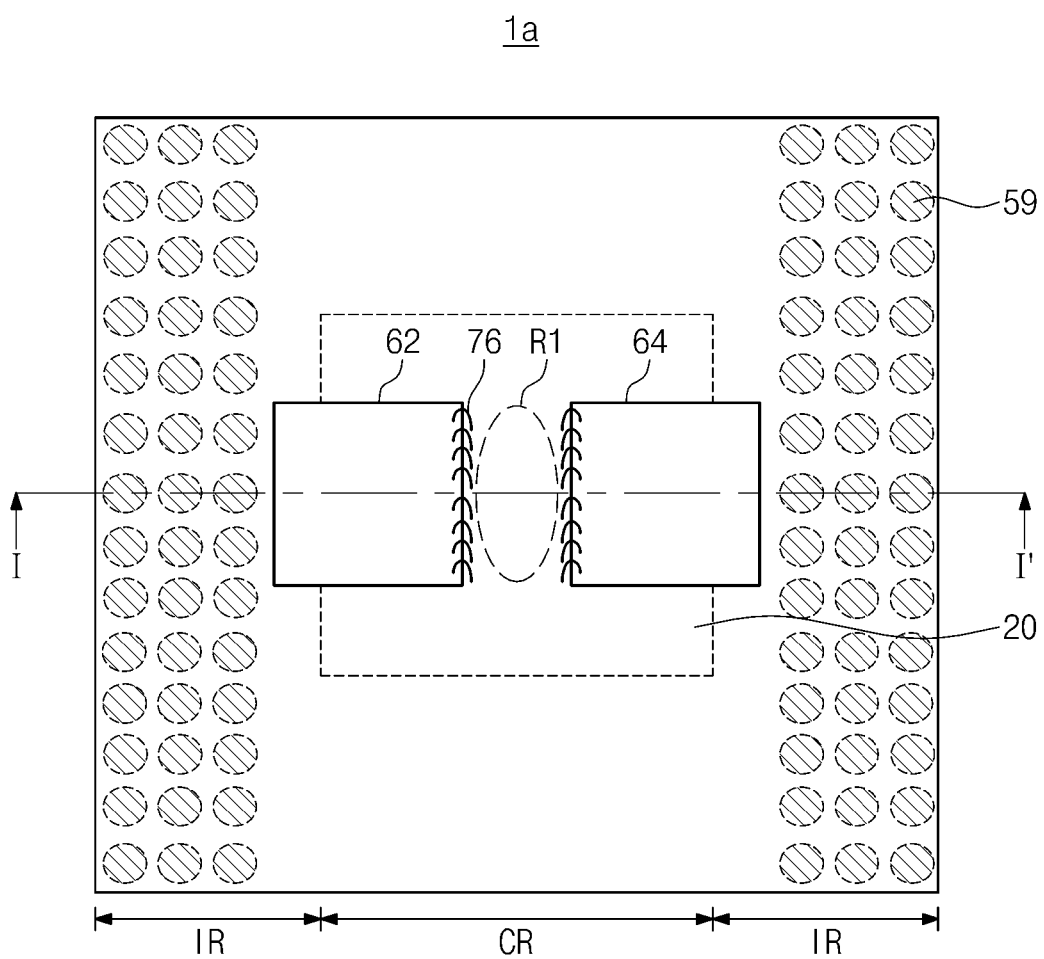
FIG. 3 is a plan view illustrating a semiconductor package according to a modified embodiment of FIG. 1.

FIG. 1 is a plan view illustrating a semiconductor package according to example embodiments of the inventive concept, and FIG. 2 is an exemplary sectional view taken along a line I-I' of FIG. 1. FIG. 3 is a plan view illustrating a semiconductor package according to a modified embodiment of FIG. 1.

Referring to FIGS. 1 and 2, a semiconductor package 1 may include a lower package 100 and an upper package 200 stacked on the lower package 100. The semiconductor package 1 may include a chip region CR and a connection region IR adjacent to the chip region CR. The chip region CR may be a central region of the semiconductor package 1, and the semiconductor package 1 may further include semiconductor chips 20, 62, and 64 provided in the chip region CR. Each semiconductor chip may be, for example, formed of a die from a wafer. The connection region IR may be the remaining region of the semiconductor package 1 other than the chip region CR and may be positioned at an edge of the semiconductor package 1.

The lower package 100 may include a lower semiconductor chip 20 disposed on a lower package substrate 10, first connecting elements 30 for electric connection between the lower package substrate 10 and the lower semiconductor chip 20, and an under-fill resin layer 40 filling gap regions between the first connecting elements 30.

The lower package substrate 10 may be, for example, a printed circuit board including a plurality of insulating layers 12. Lower connection pads 14 may be disposed on a top surface of the connection region IR of the lower package substrate 10. Chip pads 22 may be disposed in a top surface of the chip region CR of the lower package substrate 10. Ball lands 18 may be disposed on a bottom surface of the lower package substrate 10. An outer terminal 16 may be attached to each of the ball lands 18. The outer terminals 16 may connect the semiconductor package electrically to an external device.

The lower semiconductor chip 20 may be mounted on the lower package substrate 10 in a flip-chip bonding manner. The lower semiconductor chip 20 may include a semiconductor device such as a logic device, a memory device, or a combination thereof.

As used herein, a semiconductor device may refer to, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Some of these features are described in more detail below.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

The first connecting elements 30 may be attached to a bottom surface 20a of the lower semiconductor chip 20. The bottom surface 20a may serve as an active surface of the lower semiconductor chip 20. The first connecting elements 30 may include, for example, solder bumps or solder balls. The first connecting elements 30 may be in contact with the chip pads 22, respectively, and thus, the lower semiconductor chip 20 may be electrically connected to the lower package substrate 10.

The under-fill resin layer 40 may be provided on the lower package substrate 10 to fill spaces between the first connecting elements 30. In some embodiments, the under-fill resin layer 40 may be provided to partially cover a side surface of the lower semiconductor chip 20. The under-fill resin layer 40 may be provided to completely expose a top surface 20b of the lower semiconductor chip 20 and partially expose the side surface of the lower semiconductor chip 20.

The upper package 200 may include an upper package substrate 50, the first and second upper semiconductor chips 62 and 64 provided on a top surface 51b of the upper package substrate 50, bonding wires 76 connecting the upper package substrate 50 electrically with the first and second upper semiconductor chips 62 and 64, and an upper mold layer 70 covering the first and second upper semiconductor chips 62 and 64.

The upper package substrate 50 may be a printed circuit board (PCB), in which a first insulating layer 50a, a core layer 50b, and a second insulating layer 50c are sequentially stacked. The core layer 50b may include a transformable polymer resin. For example, the core layer 50b may include at least one of materials having properties of high elongation, high toughness, and low modulus. As an example, the core layer 50b may include poly imide or liquid crystal polymer (LCP).

The upper package substrate 50 may be provided in such a way that the chip region CR thereof is located at a level different from the connection region IR thereof, thereby having a boater shape. For example, in the chip region CR, a bottom surface 51a of the upper package substrate 50 may have a recessed profile in a direction away from the lower package 100, and a top surface 51b of the upper package substrate 50 may have a protruding profile in the direction away from the lower package 100.

For example, in the chip region CR, the upper package substrate 50 may include the bottom surface 51a having a first recess region 53 and the top surface 51b having a first protruding portion 55. The first recess region 53 may face the lower semiconductor chip 20. For example, the first recess region 53 may include a first main surface 53a facing the lower semiconductor chip 20 and a first side surface 53b extending from the first main surface 53a toward the connection region IR. The first protruding portion 55 may include a second main surface 55a, which is an opposite surface of the first main surface 53a, and a second side surface 55b extending from the second main surface 55a toward the connection region IR. The first and second main surfaces 53a and 55a may be parallel to each other. Further, the first and second side surfaces 53b and 55b may be parallel to each other. The thickness of the upper package substrate 50 may be similar or substantially identical in the connection region IR and the chip region CR. The upper mold layer 70 may allow to enhance rigidity of the upper package substrate 50, which is shaped like a boater. Geometrical dimension of the upper package substrate 50 will be described later with reference to FIG. 12C.

Upper connection pads 57 may be disposed on the bottom surface 51a of the connection region IR of the upper package substrate 50. Second connecting elements 59 may be provided in the connection region IR to electrically connect the lower package substrate 10 to the upper package substrate 50. The second connecting elements 59 may include, for example, solder bumps or solder balls. As shown in FIG. 1, the second connecting elements 59 may surround the lower semiconductor chip 20. Alternatively, as shown in FIG. 3, the second connecting elements 59 may be disposed adjacent to both edges of the lower semiconductor chip 20. When taken along a line I-I' of FIG. 3, a section of the semiconductor package of FIG. 3 may be substantially the same as that of FIG. 2.

The upper mold layer 70 may be provided on the upper package substrate 50 to mold the first and second upper semiconductor chips 62 and 64. The upper mold layer 70 may include, for example, an epoxy molding compound (EMC).

First and second wire pads 72a and 72b may be provided on the top surface 51b of the chip region CR of the upper package substrate 50. For example, the first and second wire pads 72a and 72b may be provided in a center region R1 of the upper package substrate 50. The first upper semiconductor chips 62 may be spaced apart from the second upper semiconductor chips 64 by the center region R1.

The first and second upper semiconductor chips 62 and 64 may be provided in the chip region CR of the upper package substrate 50. As an example, as shown in FIGS. 1 and 2, the first and second upper semiconductor chips 62 and 64 may be disposed on the upper package substrate 50 in such a way that the first and second upper semiconductor chips 62 and 64 are overlapped with the lower semiconductor chip 20. The first upper semiconductor chips 62 may be disposed to cross the first side surface 5a of the lower semiconductor chip 20, and the second upper semiconductor chips 64 may be disposed to cross the second side surface 5b of the lower semiconductor chip 20. The second side surface 5b may be positioned opposite to the first side surface 5a. For example, each of the first and second upper semiconductor chips 62 and 64 may protrude from the chip region CR toward the connection region IR. As an example, as shown in FIG. 1, the first upper semiconductor chips 62 may cross the first side surface 5a of the lower semiconductor chip 20 and protrude toward the connection region IR, and the second upper semiconductor chips 64 may cross the second side surface 5b of the lower semiconductor chip 20 and protrude toward the connection region IR.

The first and second upper semiconductor chips 62 and 64 may be fixed to the upper package substrate 50 by adhesive layers 80. The first and second upper semiconductor chips 62 and 64 may include a logic device, a memory device, or a combination thereof. Alternatively, at least one of the first and second upper semiconductor chips 62 and 64 may be a memory device, and the other of the first and second upper semiconductor chips 62 and 64 may be a logic device.

First bonding pads 74a may be disposed on the first upper semiconductor chips 62. As an example, the first bonding pads 74a may be provided on edges of the first upper semiconductor chips 62 that are adjacent to the center region R1 of the upper package substrate 50. The first bonding pads 74a may be connected to the first wire pads 72a, which are provided in the center region R1 of the upper package substrate 50, through the bonding wires 76. Accordingly, the first upper semiconductor chips 62 may be electrically connected to the upper package substrate 50.

Similarly, second bonding pads 74b may be disposed on edges of the second upper semiconductor chips 64 that are adjacent to the center region R1 of the upper package substrate 50. The second bonding pads 74b may be connected to the second wire pads 72b, which are disposed in the center region R1 of the upper package substrate 50, through the bonding wires 76. Accordingly, the second upper semiconductor chips 64 may be electrically connected to the upper package substrate 50.

The upper package 200 may be stacked on the lower package 100 in such a way that the lower semiconductor chip 20 is partially or wholly inserted into the first recess region 53 of the upper package substrate 50. The top surface 20b of the lower semiconductor chip 20 may be spaced apart from the bottom surface 51a of the upper package substrate 50. In other embodiments, the top surface 20b of the lower semiconductor chip 20 may be in contact with the bottom surface 51a of the upper package substrate 50.

According to example embodiments, the first recess region 53 of the upper package substrate 50 may be configured to accept an upper portion or an entire portion of the lower semiconductor chip 20. Furthermore, the upper package substrate 50 may be closer to the lower package substrate 10 in the connection region IR than the chip region CR. Owing to the boater-shaped structure of the upper package substrate 50, it is possible to reduce the distance between the upper and lower package substrates 50 and 10 in the connection region IR, and this makes it possible to reduce a volume of respective one of the second connecting elements 59. Further, the reduction in volume of the second connecting elements 59 may mean a reduction in pitch of the second connecting elements 59; for example, the second connecting elements 59 can have a fine pitch.

According to example embodiments of the inventive concept, each of the first and second upper semiconductor chips 62 and 64, which are mounted on the upper package substrate 50, may protrude from the chip region CR toward the connection region IR, and thus, it is possible to increase an area of an wiring region, which is positioned in the chip region CR and is used for interconnection with the bonding wires 76.

In addition, since each of the first and second upper semiconductor chips 62 and 64 is disposed extending to the connection region IR beyond the chip region CR, the first and second wire pads 72a and 72b may be disposed close to the upper connection pads 57. Therefore, it is possible to reduce a length of an electric path between the first wire pads 72a and the upper connection pads 57 provided on a left portion of the connection region IR and between the second wire pads 72b and the upper connection pads 57 provided on a right portion of the connection region IR.

Heat may be generated from the first and second upper semiconductor chips 62 and 64 and may be discharged to the outside of the semiconductor package through not only the upper package substrate 50 but also the upper mold layer 70. Here, as described above, since the first and second upper semiconductor chips 62 and 64 are disposed extending to the connection region IR beyond the chip region CR, it is possible to reduce distances between left side surfaces of the first upper semiconductor chip 62 and the upper mold layer 70 and between right side surfaces of the second upper semiconductor chip 64 and the upper mold layer 70. Accordingly, it is possible to more efficiently discharge heat generated from the first and second upper semiconductor chips 62 and 64 to the outside of the semiconductor package through the upper mold layer 70.

Figure 4:
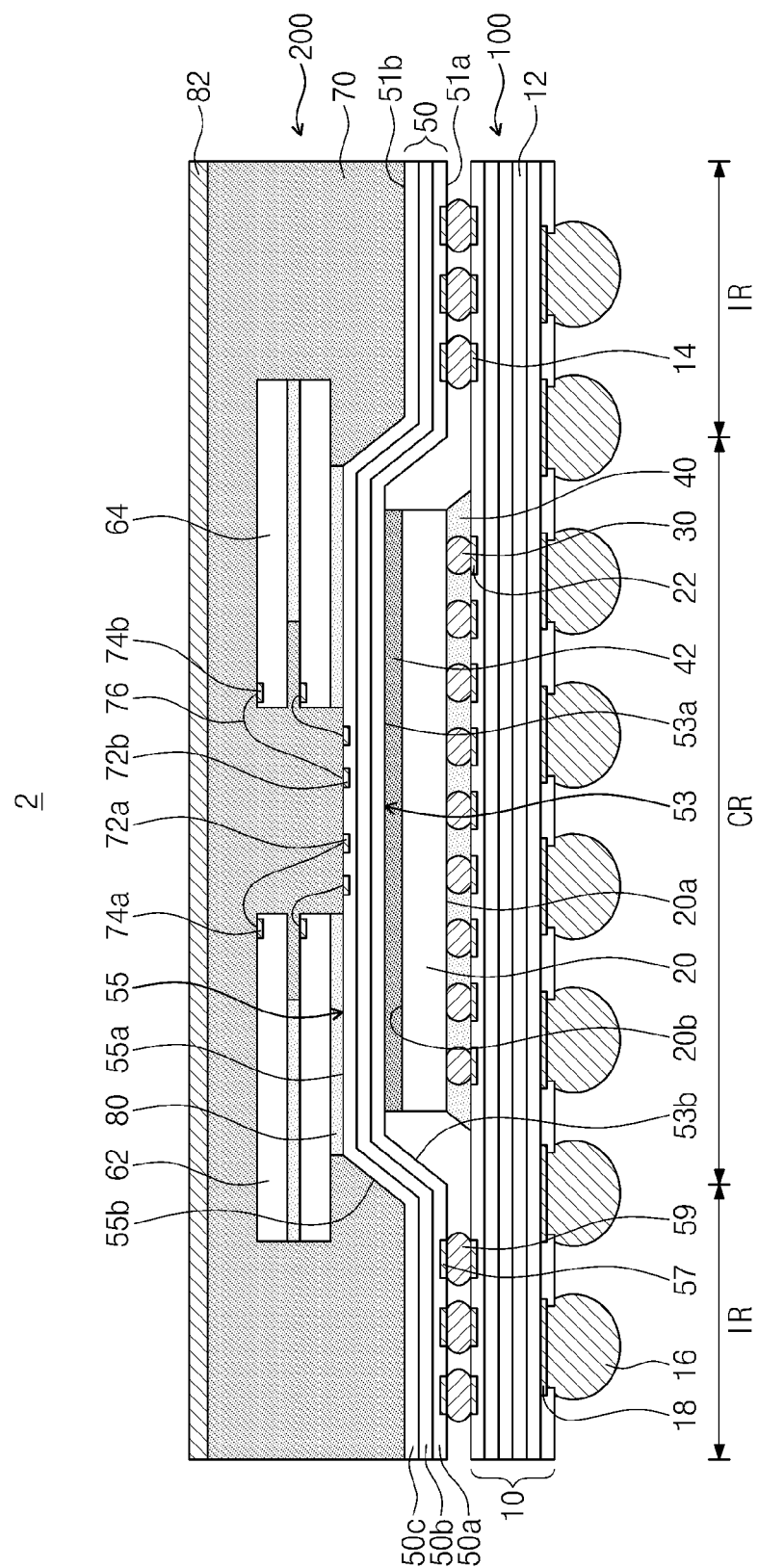
FIG. 4 is a sectional view illustrating a semiconductor package according to a modified embodiment of FIG. 2.

FIG. 4 is a sectional view illustrating a semiconductor package according to a modified embodiment of FIG. 2. In the description of the embodiment that follows, the descriptions of features that are the same as those in FIG. 2 may be omitted in order to avoid repetition.

Referring to FIG. 4, a semiconductor package 2 may further include a heat-transfer layer 42 disposed between the lower semiconductor chip 20 and the upper package substrate 50. The heat-transfer layer 42 may be provided between the top surface 20b of the lower semiconductor chip 20 and the first main surface 53a of the first recess region 53 of the upper package substrate 50. The heat-transfer layer 42 may include, for example, a thermal interface material (TIM).

The semiconductor package 2 may further include a heat sink 82 provided on the upper mold layer 70. The heat sink 82 may be a metal plate, which includes copper (Cu), nickel (Ni), gold (Au), tin (Sn), or alloys thereof.

Figure 5:
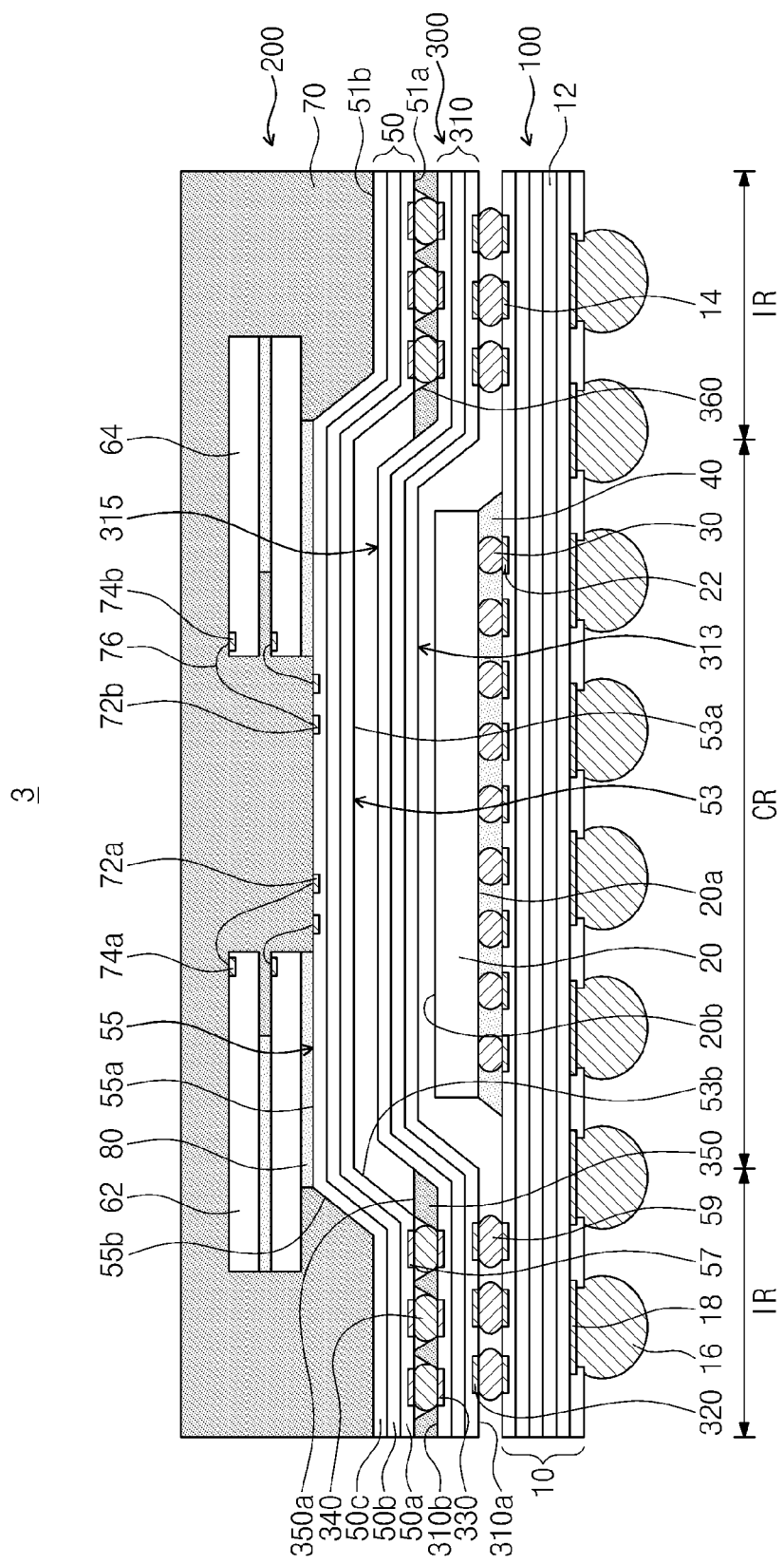
FIG. 5 is a sectional view illustrating a semiconductor package according to another modified embodiment of FIG. 2.

FIG. 5 is a sectional view illustrating a semiconductor package according to another modified embodiment of FIG. 2. In the description of the embodiment that follows, the descriptions of features that are the same as those in FIG. 2 may be omitted in order to avoid repetition.

Referring to FIG. 5, a semiconductor package 3 may further include an interposer 300 disposed between the lower package 100 and the upper package 200. The interposer 300 may include an interposer substrate 310 and an interposer mold layer 350.

The interposer substrate 310 may be provided to have a boater-shaped structure, which is similar to the upper package substrate 50 shown in FIG. 2. For example, in the chip region CR, the interposer substrate 310 may have a bottom surface 310a, which is formed to define a second recess region 313, and a top surface 310b, which is formed to face the second recess region 313 and define a second protruding portion 315. The interposer substrate 310 may include a material that is the same as or similar to that of the upper package substrate 50 of FIG. 2.

Interposer lower connection pads 320 may be provided on the bottom surface 310a of the interposer substrate 310 of the connection region IR. The interposer lower connection pads 320 may be arranged in the connection region IR of the interposer substrate 310 and face the lower connection pads 14. The second connecting elements 59 may be provided between the lower connection pads 14 and the interposer lower connection pads 320.

In the connection region IR, interposer upper connection pads 330 may be provided on the top surface 310b of the interposer substrate 310. Third connecting elements 340 may be provided in the connection region IR to connect the upper package substrate 50 electrically to the interposer substrate 310. The third connecting elements 340 may be disposed between the interposer upper connection pads 330 and the upper connection pads 57. The third connecting elements 340 may include, for example, solder bumps or solder balls.

In the connection region IR, the top surface 310b of the interposer substrate 310 may be covered with the interposer mold layer 350. The interposer mold layer 350 may be provided to have a flat top surface 350a. As an example, in the chip region CR, the top surface 350a of the interposer mold layer 350 may be positioned at a level that is the same as or lower than the top surface 310b of the interposer substrate 310. The interposer mold layer 350 may enhance rigidity of the interposer substrate 310, and thus, the interposer substrate 310 may be prevented from being deformed.

The interposer mold layer 350 may be provided to have through holes 360, in which the third connecting elements 340 are provided. The through holes 360 may be formed to expose the interposer upper connection pads 330, respectively. Each of the through holes 360 may be shaped in such a way that an upper width thereof is larger than a lower width thereof. For example, each of the through holes 360 may be formed to have a taper shape.

According to example embodiments, the interposer substrate 310 shaped like the boater may be closer to the lower package substrate 10 in the connection region IR than in the chip region CR. For example, it is possible to reduce a distance between the interposer substrate 310 and the upper package substrate 50, in the connection region IR, and thus, the second connecting elements 59 can be formed to have a reduced pitch.

In addition, the upper package substrate 50 shaped like the boater may be closer to the interposer substrate 310 in the connection region IR than in the chip region CR. For example, it is possible to reduce a distance between the upper package substrate 50 and the interposer substrate 310, in the connection region IR, and thus, the third connecting elements 340 can be formed to have a reduced pitch.

Figure 6:
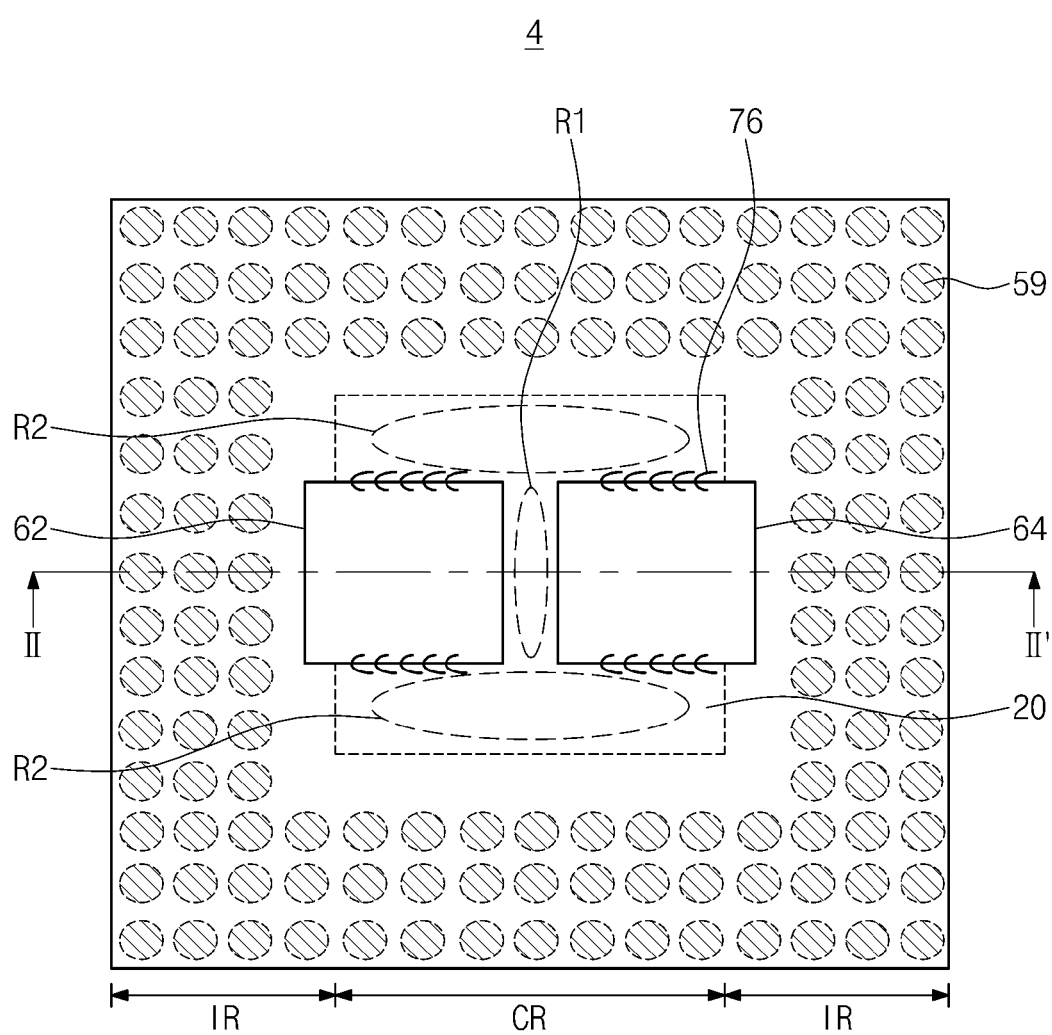
FIG. 6 is a plan view illustrating a semiconductor package according to other example embodiments of the inventive concept.
Figure 7:
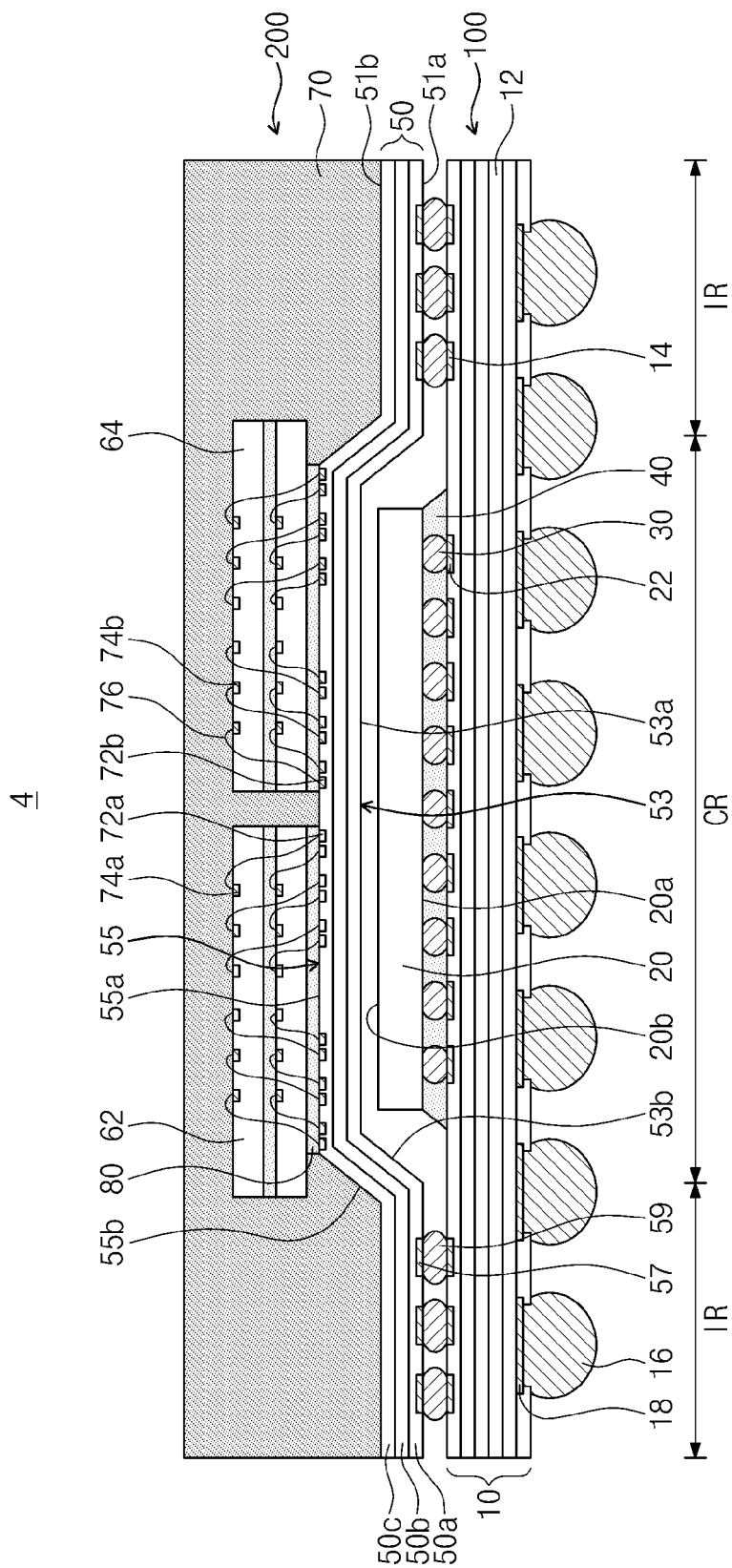
FIG. 7 is an exemplary sectional view taken along a line II-II' of FIG. 6.

FIG. 6 is a plan view illustrating a semiconductor package according to other example embodiments of the inventive concept, and FIG. 7 is a sectional view taken along a line II-II' of FIG. 6. In the description of the embodiment that follows, the descriptions of features that are the same as those in FIG. 2 may be omitted in order to avoid repetition.

Referring to FIGS. 6 and 7, in a semiconductor package 4, the upper package 200 may be stacked on the lower package 100. The upper package 200 may include the bonding wires 76 provided in an edge region R2 of the upper package substrate 50. In some embodiments, the first bonding pads 74a may be arranged on both edges of each of the first upper semiconductor chips 62 adjacent to the edge region R2 of the upper package substrate 50. The first bonding pads 74a may be connected to the first wire pads 72a, which are provided in the edge region R2 of the upper package substrate 50, through the bonding wires 76. The second bonding pads 74b may be connected to the second wire pads 72b, which are provided in the edge region R2 of the upper package substrate 50, through the bonding wires 76. The bonding wires 76 may not be provided in the center region R1 of the upper package substrate 50 and may be provided in the edge region R2 of the upper package substrate 50.

As described with reference to FIG. 2, the first and second wire pads 72a and 72b can be disposed closer to the upper connection pads 57, and thus, it is possible to shorten electric paths from or to the first and second upper semiconductor chips 62 and 64. In addition, it is possible to more efficiently discharge heat generated in the first and second upper semiconductor chips 62 and 64 to the outside of the semiconductor package through the upper mold layer 70.

Figure 8:
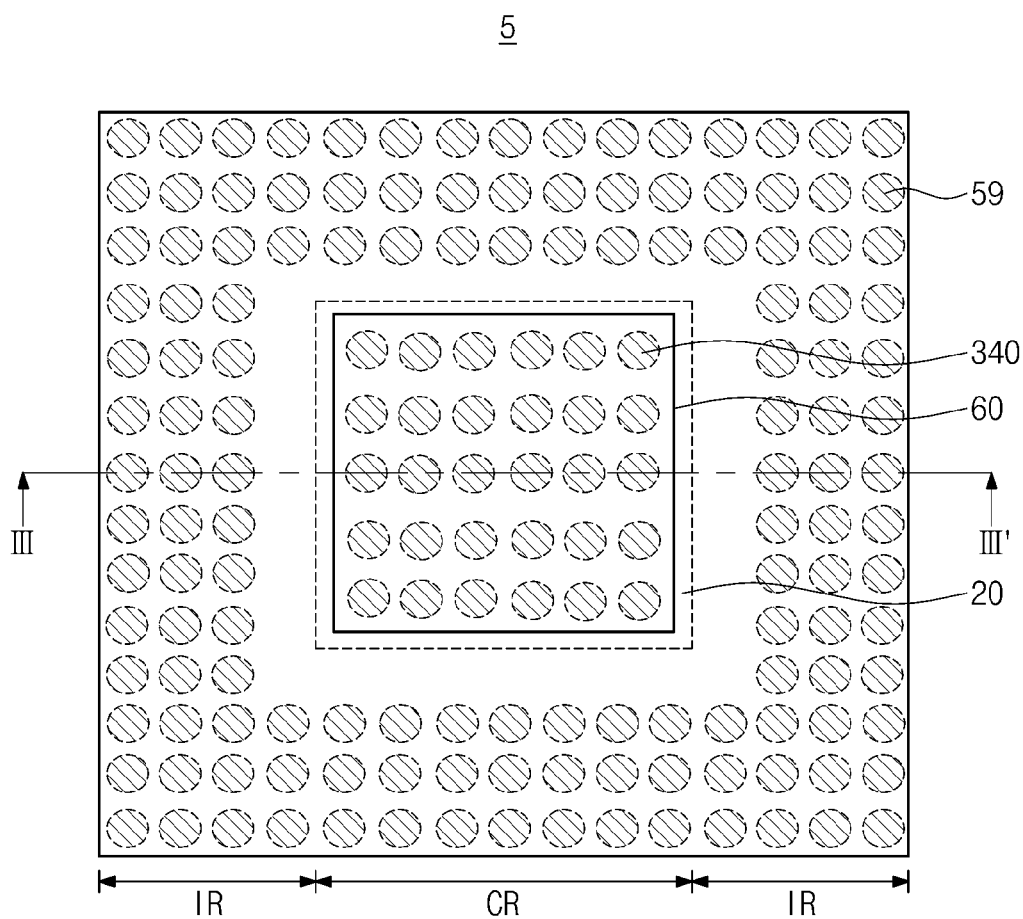
FIG. 8 is a plan view illustrating a semiconductor package according to still other example embodiments of the inventive concept.
Figure 9:
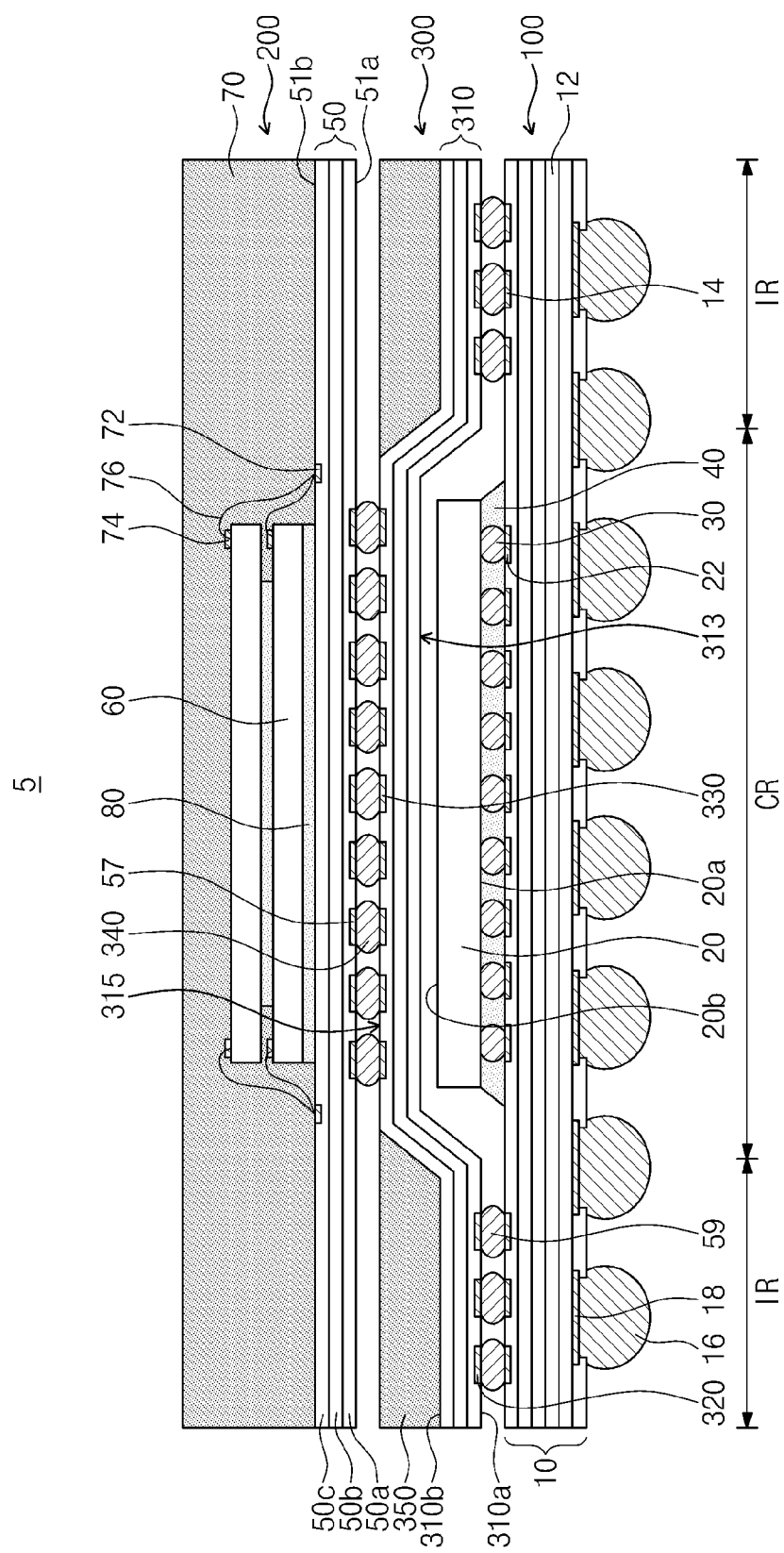
FIG. 9 is an exemplary sectional view taken along a line III-III' of FIG. 8.

FIG. 8 is a plan view illustrating a semiconductor package according to still other example embodiments of the inventive concept, and FIG. 9 is a sectional view taken along a line III-III' of FIG. 8. In the description of the embodiment that follows, the descriptions of features that are the same as those in FIGS. 1 and 2 may be omitted in order to avoid repetition.

Referring to FIGS. 8 and 9, a semiconductor package 5 may further include the interposer 300 disposed between the lower package 100 and the upper package 200. The interposer substrate 310 of the interposer 300 may be provided to have a boater-shaped structure, which is similar to the upper package substrate 50 shown in FIG. 2.

For example, in the chip region CR, the interposer substrate 310 may have a bottom surface 310a, which is formed to define a second recess region 313, and a top surface 310b, which is formed to face the second recess region 313 and define a second protruding portion 315. The interposer substrate 310 may include a material that is the same as or similar to that of the upper package substrate 50 of FIG. 2.

The interposer upper connection pads 330 and the third connecting elements 340 may be disposed in the chip region CR of the interposer substrate 310.

According to example embodiments, the upper package substrate 50 may be shaped like a substantially flat plate. Upper connection pads 57 may be disposed in the chip region CR of the upper package substrate 50. Accordingly, the upper package substrate 50 may be electrically connected to the interposer substrate 310 via the third connecting elements 340 in the chip region CR.

Upper semiconductor chips 60 may be provided on the upper package substrate 50. The upper semiconductor chips 60 may be provided in the central region of the chip region CR of the upper package substrate 50. Each of the upper semiconductor chips 60 may be a logic device, a memory device, or a combination thereof. Alternatively, at least one of the upper semiconductor chips 60 may be a memory device, and the other of the upper semiconductor chips 60 may be a logic device. Bonding pads 74 may be provided on each of the upper semiconductor chips 60. The bonding pads 74 may be electrically connected to wire pads 72 through the bonding wires 76. Accordingly, the upper semiconductor chips 60 may be electrically connected to the upper package substrate 50.

According to example embodiments, the interposer substrate 310 may be provided to have the second recess region 313, in which an upper portion or an entire portion of the lower semiconductor chip 20 can be acceptable. Furthermore, the interposer substrate 310 may be disposed in such a way that a distance between the interposer substrate 310 and the lower package substrate 10 is smaller in the connection region IR than in the chip region CR. Owing to the boater-shaped structure of the interposer substrate 310, it is possible to reduce the distance between the interposer substrate 310 and the lower package substrate 10, in the connection region IR, and thus, this makes it possible to realize a reduction in pitch of the second connecting elements 59.

Further, since the interposer substrate 310 shaped like the boater is disposed between the lower and upper package substrates 10 and 50, the third connecting element 340 may be disposed in the chip region CR. In some embodiments, the third connecting element 340 may be disposed in the connection region IR or in both the chip and connection regions CR and IR. As such, according to example embodiments, it is possible to reduce technical limitations on a ball layout of the semiconductor package 5.

Figure 10:
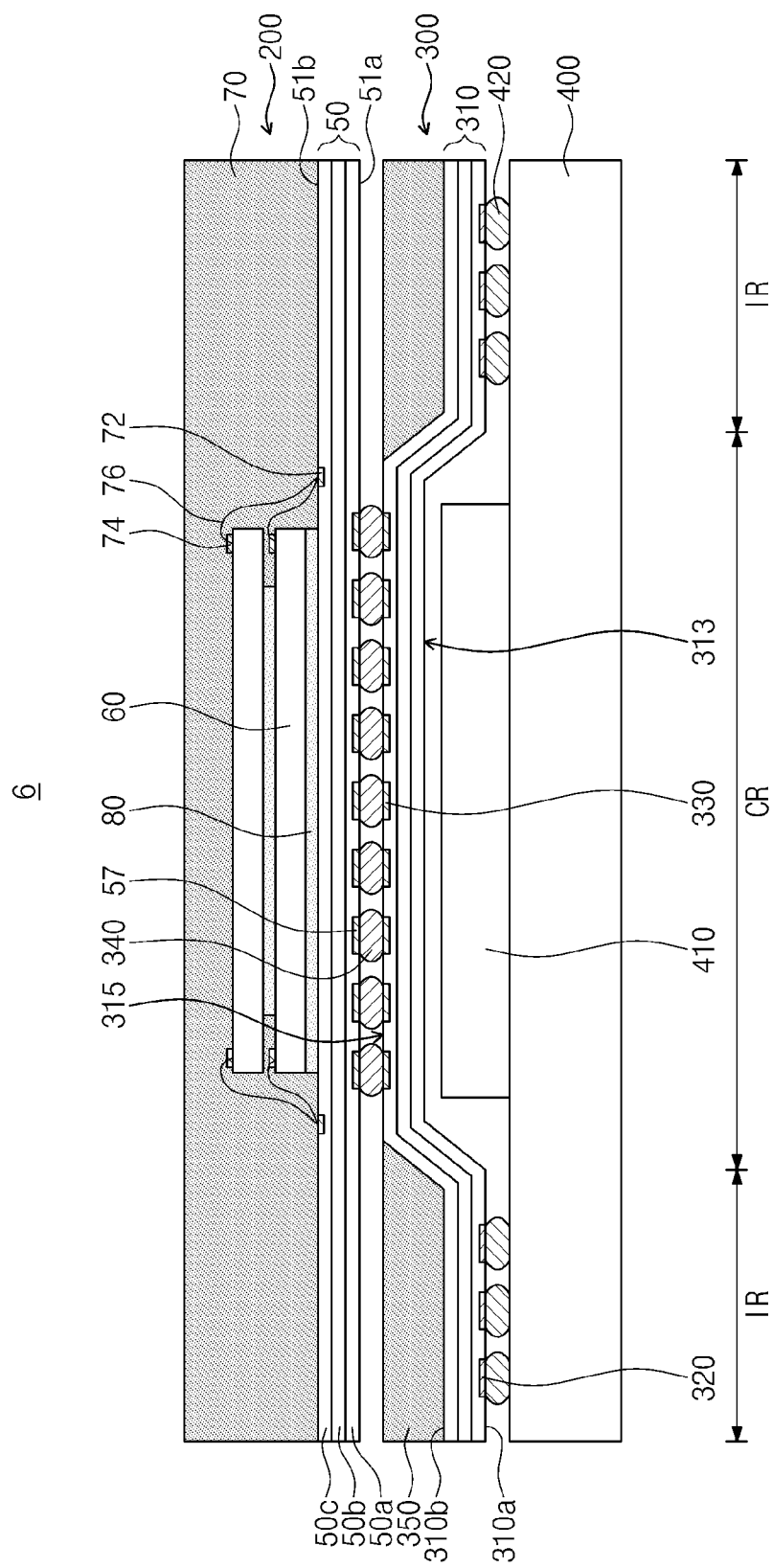
FIG. 10 is a sectional view illustrating a semiconductor package according to a modified embodiment of FIG. 9.

FIG. 10 is a sectional view illustrating a semiconductor package according to a modified embodiment of FIG. 9. In the description of the embodiment that follows, the descriptions of features that are the same as those in FIG. 9 may be omitted in order to avoid repetition.

Referring to FIG. 10, a semiconductor package 6 may include a printed circuit board 400, the interposer 300, and the upper package 200. A lower package 410 may be stacked on the printed circuit board 400. The interposer 300 and the upper package 200 may be sequentially stacked on the printed circuit board 400.

The lower package 410 may be one of package-on-package, chip-on-package, system-on-package, and wafer level package structures.

The interposer lower connection pads 320 may be provided on the bottom surface 310*a* of the interposer substrate 310 and may be connected to pad portions 420 provided on the printed circuit board 400. The lower package 410 may be inserted into the second recess region 313 of the interposer 300.

Figure 11:
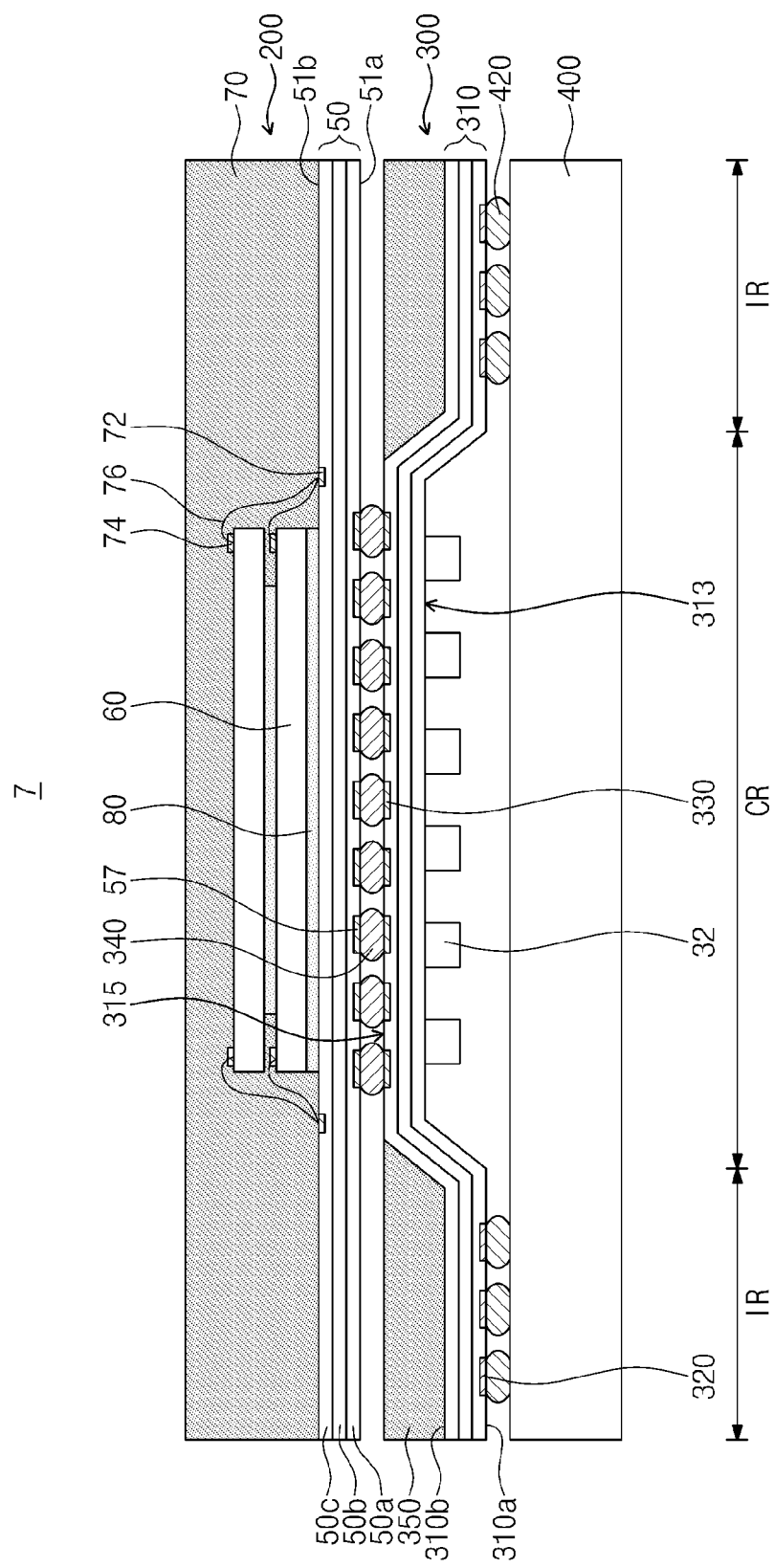
FIG. 11 is a sectional view illustrating a semiconductor package according to another modified embodiment of FIG. 9.

FIG. 11 is a sectional view illustrating a semiconductor package according to another modified embodiment of FIG. 9. In the description of the embodiment that follows, the descriptions of features that are the same as those in FIG. 9 may be omitted in order to avoid repetition.

Referring to FIG. 11, in a semiconductor package 7, a plurality of passive devices 32 may be provided in the second recess region 313 of the interposer 300. In detail, the passive devices 32 may be attached to the bottom surface 310*a* of the interposer substrate 310. Each of the passive devices 32 may be, for example, a chip capacitor, a chip resistor, or an inductor. The chip capacitor may be provided in the form of a decoupling capacitor. The passive devices 32 may be configured to increase a signal processing speed of the upper semiconductor chips 60 or serve as a filter.

Figure 12A:
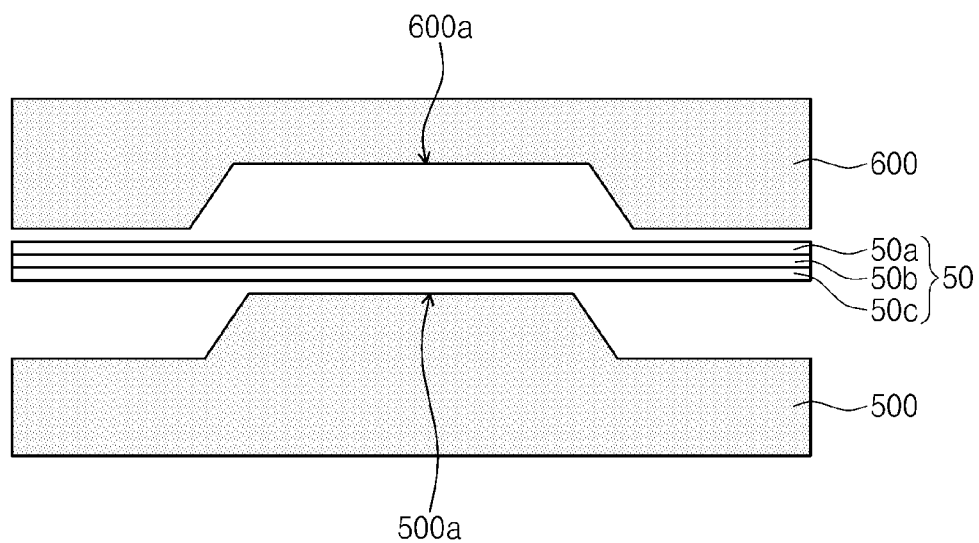
Figure 12B:
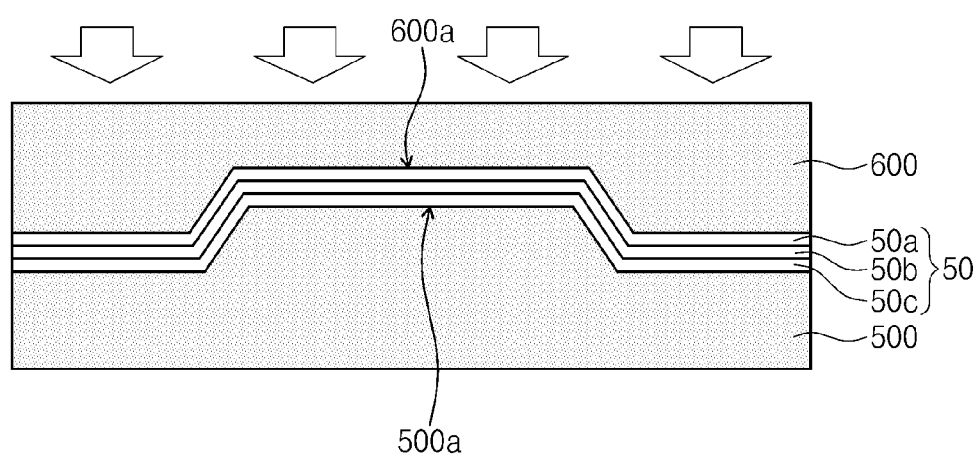

FIGS. 12A through 12C are sectional views illustrating a method of fabricating an upper package substrate according to example embodiments of the inventive concept. In the description of the embodiment that follows, the descriptions of features that are the same as those in FIG. 2 may be omitted in order to avoid repetition.

Referring to FIG. 12A, a first lower mold 500 and a first upper mold 600 may be prepared. The first lower mold 500 may include a mound 500*a* which protrudes in a central region thereof. The first upper mold 600 may include a sink 600*a* which is recessed in the central region thereof. The mound 500*a* and the sink 600*a* may be provided in such a way that the first lower mold 500 and the first upper mold 600 are fittingly engaged with each other. The upper package substrate 50 may be provided between the first lower mold 500 and first upper mold 600.

Referring to FIG. 12B, heat and pressure may be applied to at least one of the first lower mold 500 and the first upper mold 600 to press the upper package substrate 50. Accordingly, the upper package substrate 50 provided between the first lower mold 500 and the first upper mold 600 may be deformed to have a profile given by the first lower mold 500 and the first upper mold 600.

Referring to FIG. 12C, the first lower mold 500 and the first upper mold 600 may be detached from the upper package substrate 50, and thus, the upper package substrate 50 may be formed to have the first recess region 53 and the first protruding portion 55. The upper package substrate 50 may be divided into the chip region CR and the connection region IR, as described with reference to FIG. 2. The upper package substrate 50 may be formed to have a uniform thickness. In the upper package substrate 50, a height difference between the bottom surface 51*a* of the connection region IR and the first main surface 53*a* of the chip region CR may be equal to or less than about 1 mm. The bottom surface 51*a* and the first side surface 53*b* may be formed in such a way that an angle $\theta$ therebetween is greater than 0° and is equal to or smaller than 90°.

The upper package substrate 50 according to example embodiments may be applied to realize the semiconductor packages 1, 2, 3, and 4, which were described with reference to FIGS. 2, 4, 5, and 7, respectively. Alternatively, the respective semiconductor packages 3, 5, 6, and 7 of FIGS. 5, 9, 10, and 11 may be configured to include the interposer substrate 310, which may be fabricated by the boater-shaped structure using the methods of example embodiments.

FIGS. 13A through 13D are sectional views illustrating a method of fabricating an upper package according to example embodiments of the inventive concept. In the description of the embodiment that follows, the descriptions of features that are the same as those in FIG. 2 may be omitted in order to avoid repetition.

Figure 13A:
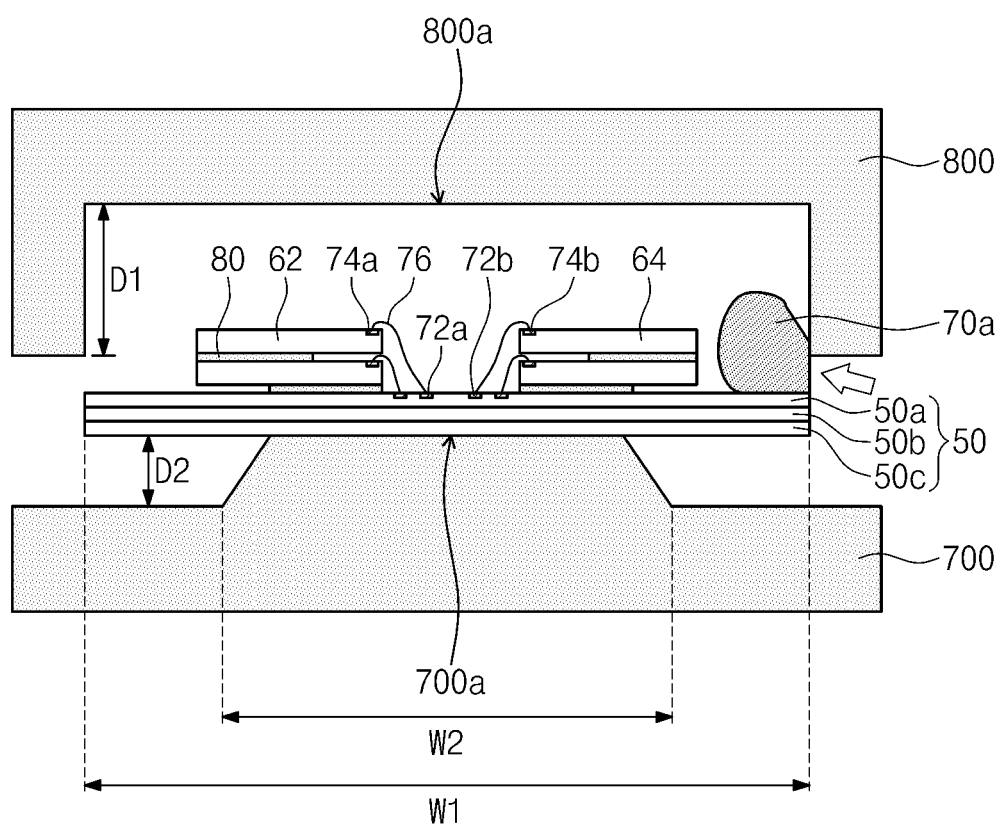
FIGS. 13A through 13D are sectional views illustrating a method of fabricating an upper package according to example embodiments of the inventive concept.

Referring to FIG. 13A, a second lower mold 700 and a second upper mold 800 may be prepared. The second lower mold 700 may include a mound 700*a* in a central region thereof. The second upper mold 800 may include a sink 800*a* in a central region thereof. The mound 700*a* may be formed to have a different shape from that of the sink 800*a*. For example, the sink 800*a* may have a depth D1 that is greater than a thickness D2 of the mound 700*a*. Further, the sink 800*a* may have a width W1 that is greater than a width W2 of the mound 700*a*.

The upper package substrate 50, on which the first and second upper semiconductor chips 62 and 64 are mounted, may be provided between the second lower mold 700 and the second upper mold 800. The upper package substrate 50 may be provided on the second lower mold 700 and may be spaced apart from the second upper mold 800 in a vertical direction.

A molding resin 70*a* may be supplied into a space between the second upper mold 800 and the upper package substrate 50. The molding resin 70*a* may include, for example, an epoxy molding compound (EMC).

Figure 13B:
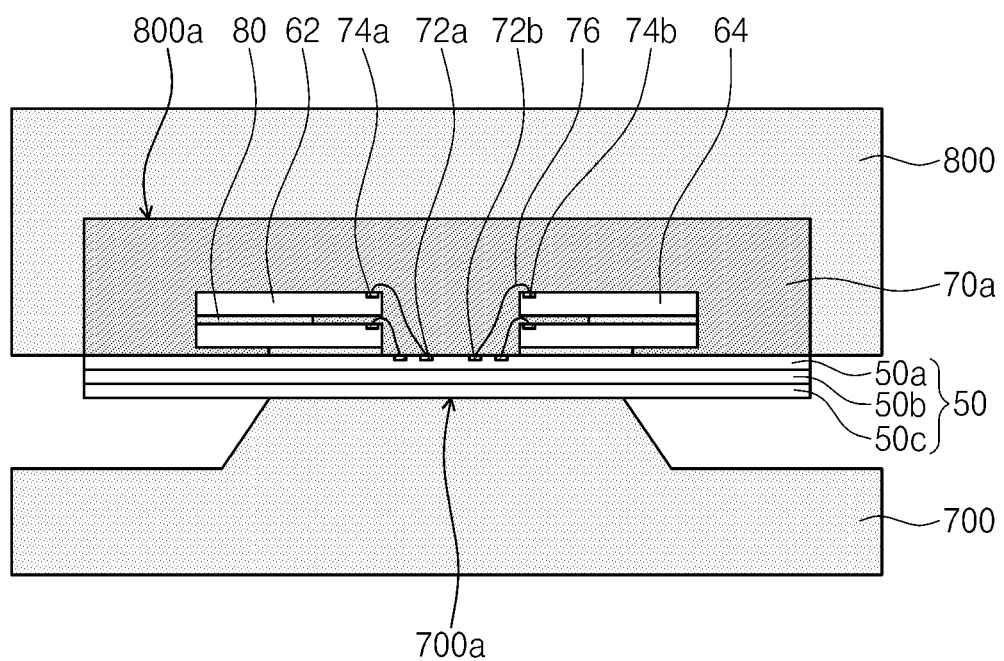

Referring to FIG. 13B, the second upper mold 800 may be moved toward the upper package substrate 50, and thus, the sink 800*a* may be filled with the supplied molding resin 70*a*.

Figure 13C:
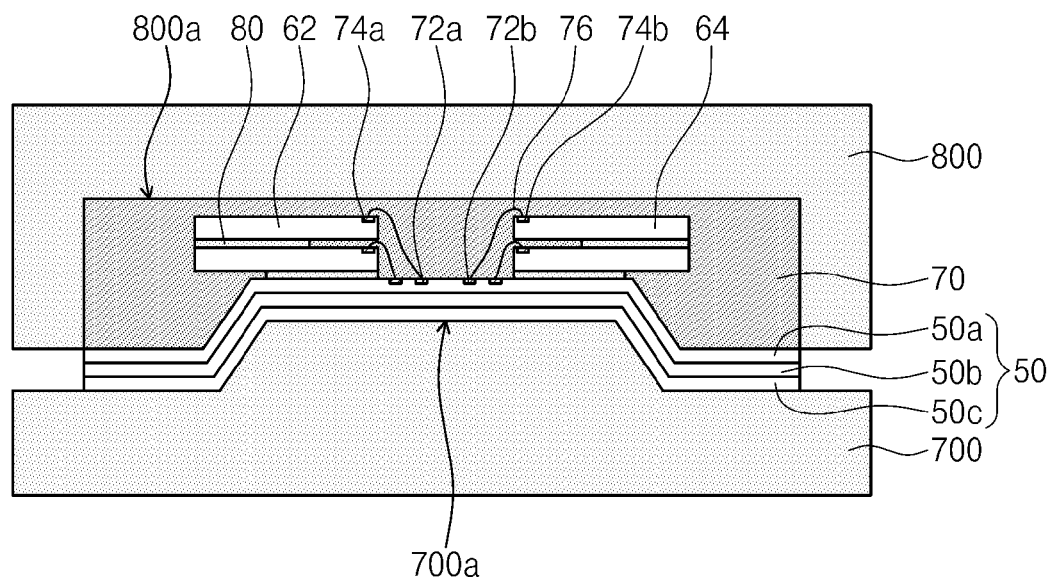

Referring to FIG. 13C, heat and pressure may be applied to at least one of the second lower mold 700 and the second upper mold 800 to press the upper package substrate 50. Accordingly, the upper package substrate 50 provided between the second lower mold 700 and the second upper mold 800 may be deformed to have a profile given by a surface shape of the second lower mold 700. For example, the upper package substrate 50 may be deformed to have a boater-shaped structure. Further, the molding resin 70*a* provided in the sink 800*a* may form the upper mold layer 70.

Figure 13D:
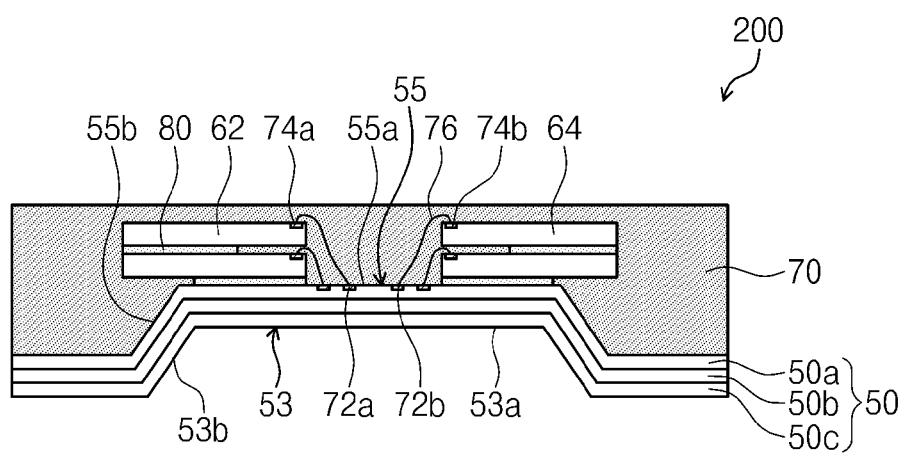

Referring to FIG. 13D, the second lower mold 700 and the second upper mold 800 may be detached from the upper package substrate 50 to form the upper package 200. The upper package 200 may include the upper package substrate 50, which is formed to have the first recess region 53 and the first protruding portion 55, and the upper mold layer 70 provided on the upper package substrate 50.

The upper package 200 according to example embodiments may be applied to realize the semiconductor packages 1, 2, 3, and 4, which were described with reference to FIGS. 2, 4, 5, and 7, respectively. Alternatively, in each of the semiconductor packages 3, 5, 6, and 7 of FIGS. 5, 9, 10, and 11, the interposer 300 may be fabricated using the methods of example embodiments.

Figure 14B:
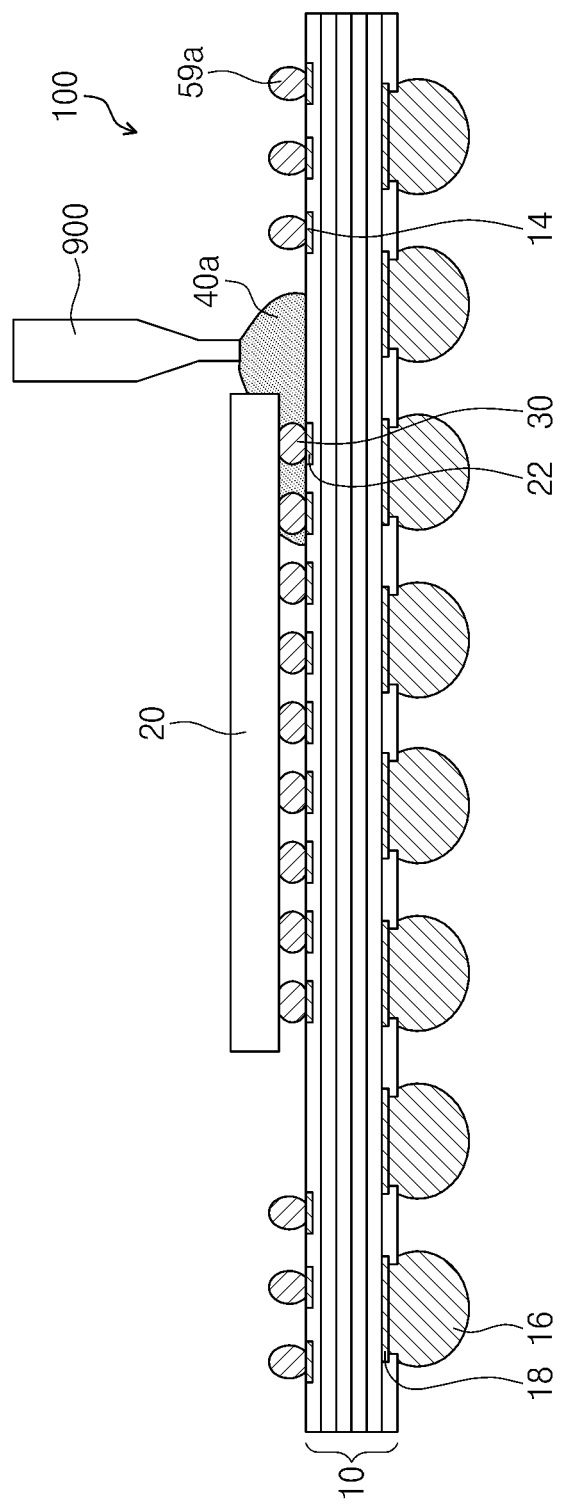
Figure 14C:
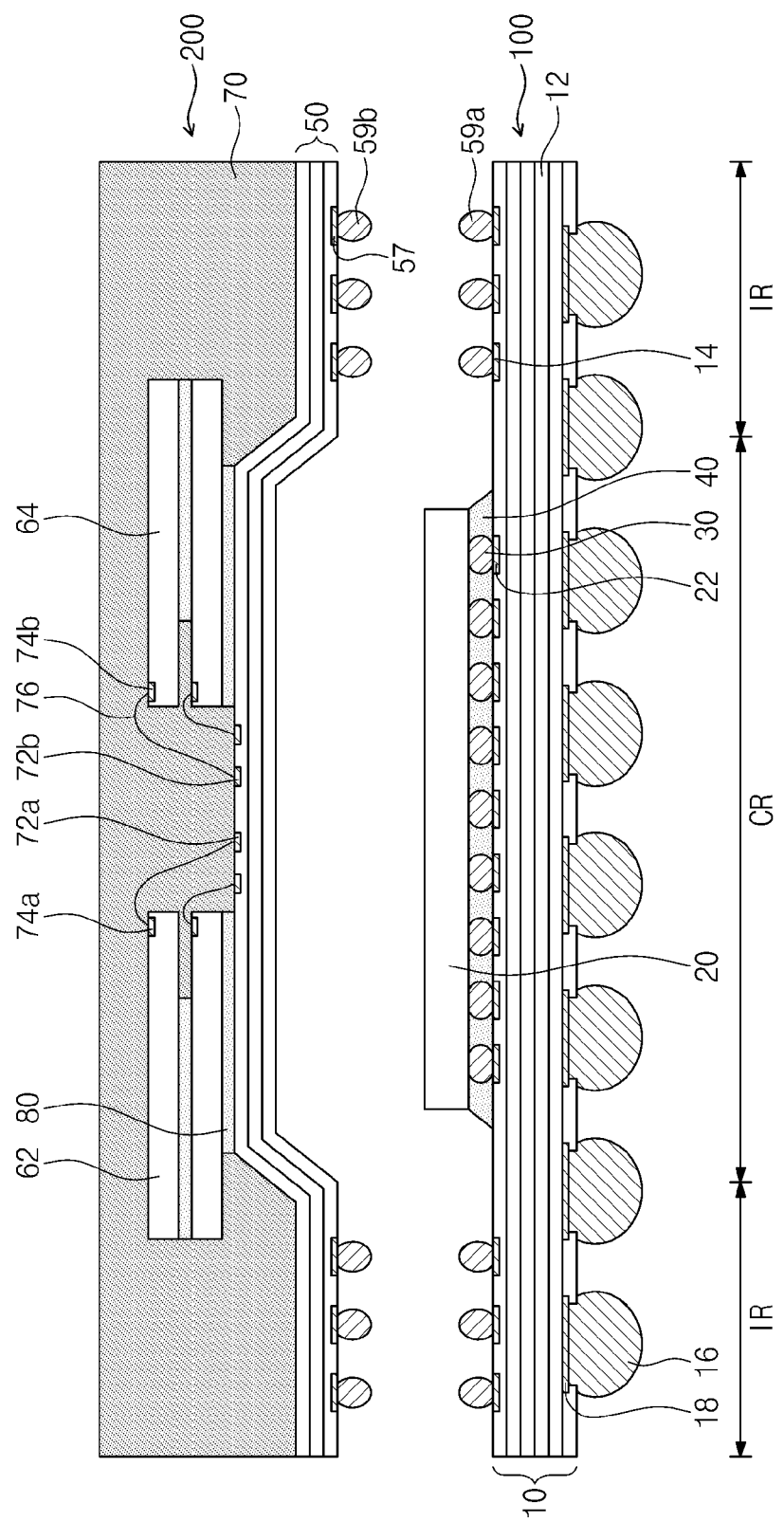

FIGS. 14A through 14C are sectional views illustrating a method of fabricating a semiconductor package according to example embodiments of the inventive concept. In the description of the embodiment that follows, the descriptions of features that are the same as those in FIG. 2 may be omitted in order to avoid repetition.

Referring to FIG. 14A, the lower package 100 may be prepared. The lower package 100 may include the lower package substrate 10, on which the lower semiconductor chip 20, the first connecting elements 30, the chip pads 22, the lower connection pads 14, first preliminary connection members 59a, and the outer terminals 16 are provided.

Referring to FIG. 14B, an underfill resin solution 40a may be supplied into a space between the lower semiconductor chip 20 and the lower package substrate 10 using a needle 900, and a hardening process may be used to solidify the underfill resin solution 40a. As shown in FIG. 4, in order to uniformly fill the entire space between the lower semiconductor chip 20 and the lower package substrate 10 with the underfill resin solution 40a, the needle 900 may be moved along the side surface of the lower semiconductor chip 20, during the supply of the underfill resin solution 40a.

Referring to FIG. 14C, the upper package 200, which may be fabricated using the method described with reference to FIGS. 13A through 13D, may be provided on the lower package 100 provided with the under-fill resin layer 40. The upper package 200 may include the upper connection pads 57 and second preliminary connection members 59b, which are provided on the bottom surface thereof, and the first and second upper semiconductor chips 62 and 64, the bonding wires 76, and the upper mold layer 70, which are provided on the top surface thereof. The lower package 100 provided on the upper package 200 may constitute the semiconductor package 1 described with reference to FIG. 2.

Alternatively, the first and second upper semiconductor chips 62 and 64 may be mounted on the upper package substrate 50, which is fabricated using the method described with reference to FIGS. 12A through 12C, thereby forming the upper package 200. Thereafter, the upper package 200 may be disposed on the lower package 100 to form the semiconductor package 1 described with reference to FIG. 2.

The afore-described semiconductor package technologies may be applied to various types of semiconductor devices and a package module including the same.

Figure 15:
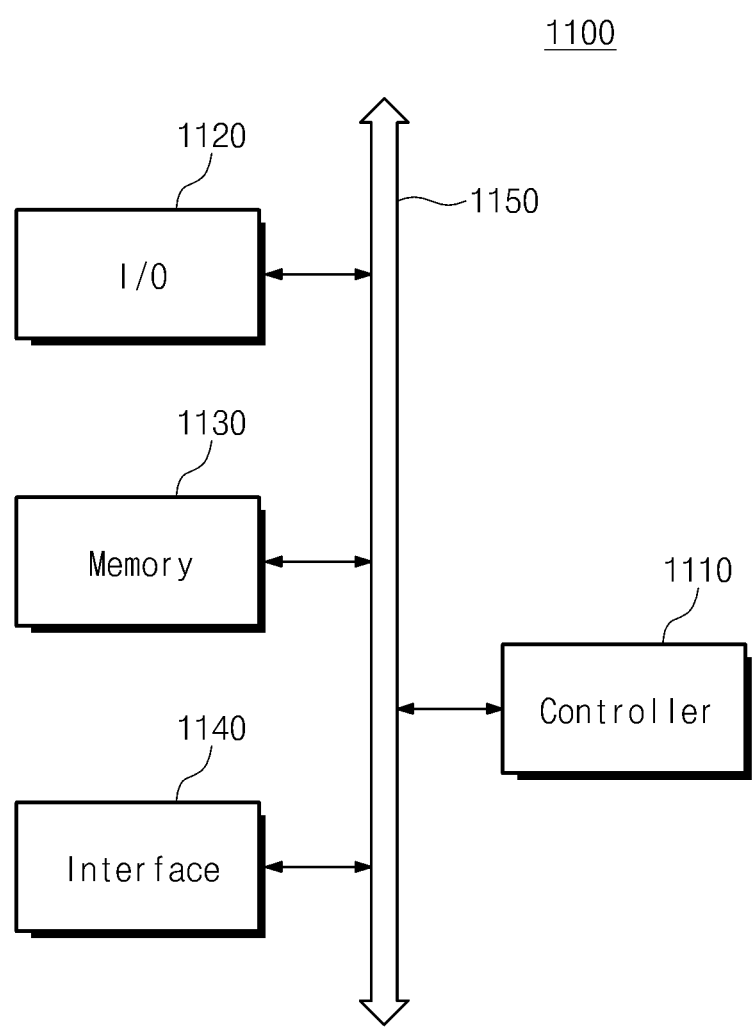
FIG. 15 is a schematic block diagram illustrating an example of electronic systems including a semiconductor package according to example embodiments of the inventive concept.

FIG. 15 is a schematic block diagram illustrating an example of electronic systems including a semiconductor package according to example embodiments of the inventive concept.

Referring to FIG. 15, an electronic system 1100 may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other via the data bus 1150. The data bus 1150 may correspond to a path through which electrical signals are transmitted. The memory device 1130 may be formed using one of the packaging techniques according to example embodiments of the inventive concept. Further, in certain embodiments, the controller 1110 and the memory device 1130 may be integrated to form a single semiconductor package.

The controller 1110 may include at least one of a microprocessor, a digital signal processor, a microcontroller, or another logic device with a similar function to any one thereof. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawing, the electronic system 1100 may further include a fast DRAM device and/or a fast SRAM device that acts as a cache memory for improving an operation of the controller 1110.

The electronic system 1100 may be applied to an electronic device such as a personal digital assistant (PDA), a portable computer, a web tablet, a wireless phone, a mobile phone, a digital music player, a memory card or another electronic product. The electronic product may receive or transmit information data wirelessly.

Figure 16:
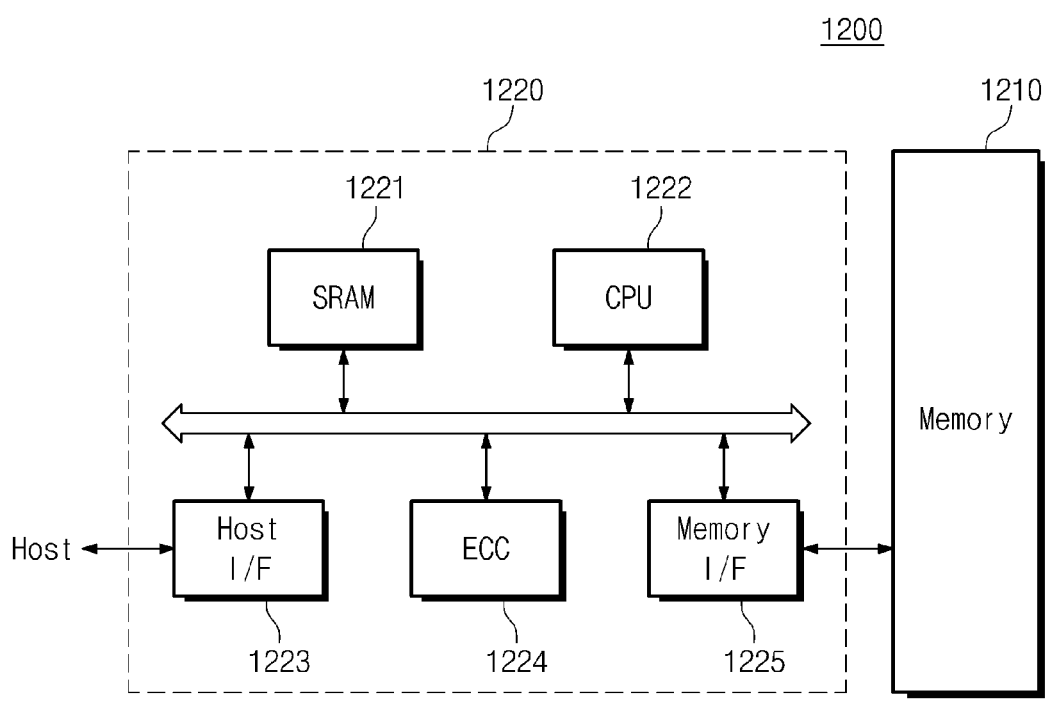
FIG. 16 is a schematic block diagram illustrating an example of memory systems including a semiconductor package according to example embodiments of the inventive concept.

FIG. 16 is a schematic block diagram illustrating an example of memory systems including the semiconductor package according to the embodiments of the inventive concept.

Referring to FIG. 16, a memory system 1200 according to example embodiments of the inventive concept may include a memory device 1210. The memory device 1210 may be one realized by the semiconductor packaging technology described above. For example, the memory device 1210 may include a nonvolatile memory device and/or a static random access memory (SRAM) device. The memory system 1200 may include a memory controller 1220 that controls data communication between a host and the memory device 1210. The memory device 1210 and/or the memory controller 1220 may be formed using one of the packaging techniques according to example embodiments of the inventive concept.

The memory controller 1220 may include a processing unit 1222 that controls overall operations of the memory system 1200. In addition, the memory controller 1220 may include an SRAM device 1221 used as an operation memory of the processing unit 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. The memory controller 1220 may further include an error correction code (ECC) block 1224. The ECC block 1224 may detect and correct errors of data which are read out from the memory device 1210. The memory system 1200 may further include a read only memory (ROM) device that stores code data to interface with the host. The memory system 1200 may be used, for example, as a portable data storage card. Alternatively, the memory system 1200 may be provided in the form of solid state disks (SSD), instead of hard disks of computer systems.

Figure 17:
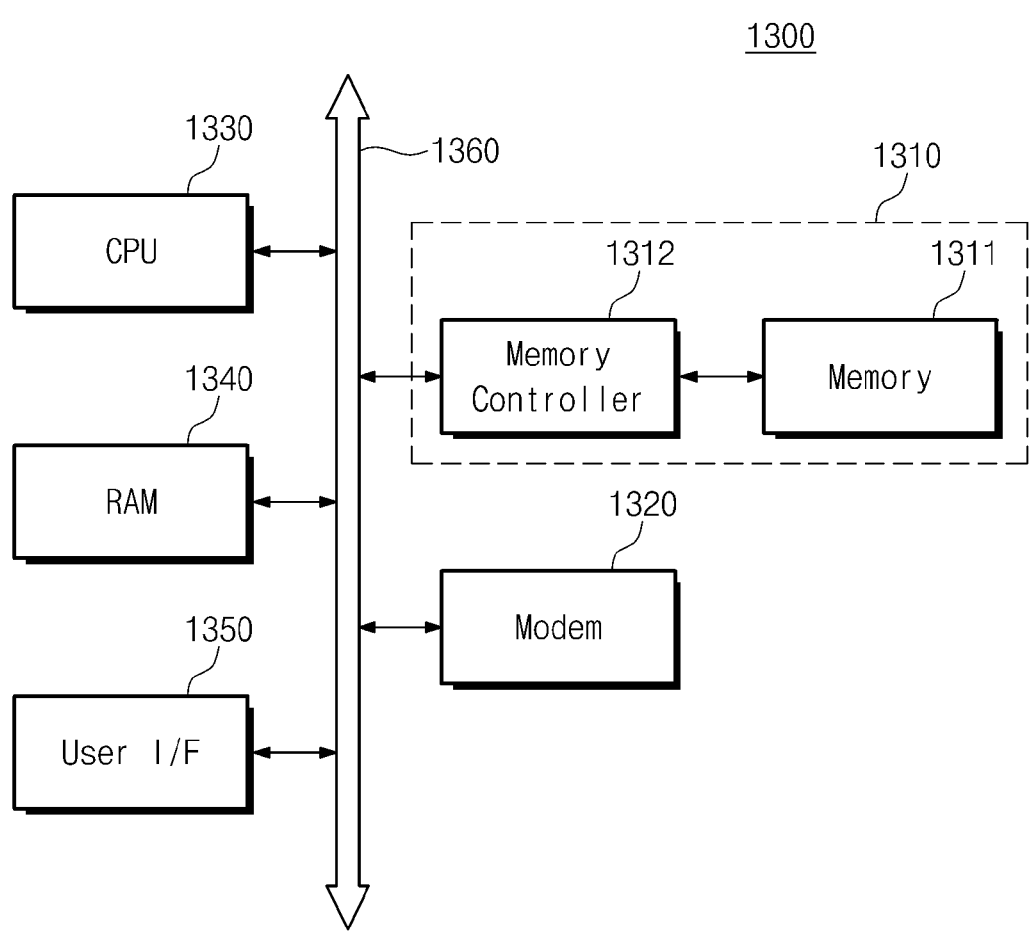
FIG. 17 is a schematic block diagram illustrating an example of information processing systems including a semiconductor package according to example embodiments of the inventive concept.

FIG. 17 is a schematic block diagram illustrating an example of information processing systems including the semiconductor package according to example embodiments of the inventive concept.

Referring to FIG. 17, an information processing system 1300 includes a memory system 1310, which may include at least one of the semiconductor packages according to example embodiments of the inventive concept. In certain embodiments, the information processing system 1300 may be used to realize an electronic device such as a mobile device or a desktop computer. The information processing system 1300 also includes a modem 1320 or other communications interface, a central processing unit (CPU) 1330, a RAM 1340, and a user interface 1350, which may be electrically connected to the memory system 1310 via a system bus 1360. The memory system 1310 may have the same configuration as that of the memory system 1200 described above. The memory system 1310 may include a memory device 1311 and a memory controller 1312 controlling an overall operation of the memory device 1311. Data processed by the CPU 1330 and/or input from the outside may be stored in the memory system 1310. Although not shown in the drawing, it will be apparent to those of ordinary skill in the art that the information processing system 1300 may be also configured to include components such as an application chipset, a camera image processor (CIS), and/or an input/output device.

According to example embodiments of the inventive concept, provided are a PoP type semiconductor package, which is configured to be able to reduce a distance between packages, and a method of fabricating the same. Accordingly, it is possible to reduce a total thickness of a semiconductor package.

Further, according to example embodiments of the inventive concept, the connecting elements can be formed to have a reduced pitch.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
    a first package including a first package substrate on which a lower semiconductor chip is mounted;
    a second package stacked on the first package, the second package including a second package substrate on which upper semiconductor chips are mounted; and
    an interposer disposed between the first package and the second package,
    wherein the second package substrate comprises:
        a chip region overlapped with the lower semiconductor chip to provide a region on which the upper semiconductor chips are mounted; and
        a connection region provided around the chip region,
    wherein the chip region comprises a first surface that faces the lower semiconductor chip and forms a first recess region and a second surface that is opposite to the first surface and forms a first protruding portion,
    wherein the upper semiconductor chips are mounted on opposite edges of the second surface and spaced apart from each other to have portions protruding toward the connection region beyond the chip region, and
    wherein each of the upper semiconductor chips extends beyond the respective edge of the second surface.

2. The semiconductor package of claim 1, wherein the lower semiconductor chip is provided in such a way that an upper or entire portion thereof is inserted into the first recess region.

3. The semiconductor package of claim 1, further comprising bonding wires connecting the upper semiconductor chips electrically to the chip region of the second package substrate.

4. The semiconductor package of claim 3, wherein the chip region of the second package substrate comprises a center region positioned between the upper semiconductor chips, and the bonding wires are provided on the center region.

5. The semiconductor package of claim 1, further comprising connecting elements connecting the connection region of the second package substrate electrically to the first package substrate.

6. The semiconductor package of claim 1, further comprising:
    first connecting elements connecting the first package substrate electrically to the interposer; and
    second connecting elements connecting the connection region of the second package substrate electrically to the interposer,
    wherein the first connecting elements are provided on an edge region of the interposer that is overlapped with the connection region, when viewed in plan view.

7. The semiconductor package of claim 6, wherein the interposer comprises third and fourth surfaces that are opposite to each other, the third surface is formed to face the lower semiconductor chip and define a second recess region on the chip region, and the fourth surface is formed to have a second protruding portion.

8. The semiconductor package of claim 7, further comprising a mold layer provided to cover the fourth surface of the interposer and enclose the second connecting elements.

9. The semiconductor package of claim 1, wherein the second package substrate is provided in such a way that the chip region protrudes toward a direction away from the lower semiconductor chip with respect to the connection region.

10. A semiconductor package, comprising:
    a first package including a first package substrate on which a lower semiconductor chip is mounted; and
    a second package stacked on the first package, the second package including a second package substrate on which upper semiconductor chips are mounted,
    wherein the second package substrate comprises:
        a chip region overlapped with the lower semiconductor chip to provide a region on which the upper semiconductor chips are mounted; and
        a connection region provided around the chip region,
    wherein the chip region comprises a first surface that faces the lower semiconductor chip and forms a first recess region and a second surface that is opposite to the first surface and forms a first protruding portion,
    wherein the upper semiconductor chips are mounted on opposite edges of the second surface and spaced apart from each other to have portions protruding toward the connection region beyond the chip region,
    wherein each of the upper semiconductor chips extends beyond the respective edge of the second surface, and
    wherein the semiconductor package further comprising a heat-transfer layer provided between the lower semiconductor chip and the first surface of the second package substrate.

11. A method of fabricating a semiconductor package, the method comprising:
- preparing a first package substrate on which a lower semiconductor chip is mounted;
- preparing a second package substrate on which first and second upper semiconductor chips are mounted, the second package substrate having first and second surfaces, which are opposite to each other and define a recess region and a protruding portion, respectively, and having a chip region overlapped with the lower semiconductor chip and a connection region adjacent to the chip region; and
- mounting the second package substrate on the first package substrate in such a way that the lower semiconductor chip faces the recess region,
- wherein the first and second upper semiconductor chips are mounted on opposite edges of the second surface of the second package substrate and spaced apart from each other to have portions protruding toward the connection region beyond the chip region of the second package substrate,
- wherein each of the first and second upper semiconductor chips extends beyond the respective edge of the second surface, and
- wherein the preparing of the second package substrate comprises:
- preparing a first mold having a protruding central region and a second mold having a recessed central region;
- disposing the second package substrate between the first and second molds;
- applying pressure to the second package substrate through the first and second molds;
- separating the second package substrate from the first and second molds;
- mounting the first and second upper semiconductor chips on the second package substrate; and
- forming a mold layer on the second package substrate.

12. The method of claim 11, wherein the preparing of the first package substrate comprises:
- disposing the lower semiconductor chip on the first package substrate; and
- forming an under-fill resin layer to fill a space between the lower semiconductor chip and the first package substrate.

13. A method of fabricating a semiconductor package, the method comprising:
- preparing a first package substrate on which a lower semiconductor chip is mounted;
- preparing a second package substrate on which first and second upper semiconductor chips are mounted, the second package substrate having first and second surfaces, which are opposite to each other and define a recess region and a protruding portion, respectively, and having a chip region overlapped with the lower semiconductor chip and a connection region adjacent to the chip region; and
- mounting the second package substrate on the first package substrate in such a way that the lower semiconductor chip faces the recess region,
- wherein the first and second upper semiconductor chips are mounted on opposite edges of the second surface of the second package substrate and spaced apart from each other to have portions protruding toward the connection region beyond the chip region of the second package substrate,
- wherein each of the first and second upper semiconductor chips extends beyond the respective edge of the second surface, and
- wherein the preparing of the second package substrate comprises:
- mounting the first and second upper semiconductor chip on the second package substrate;
- preparing a first mold having a protruding central region and a second mold having a recessed central region;
- disposing the second package substrate between the first and second molds;
- supplying a molding resin between a space between the second package substrate and the second mold; and
- applying pressure to the second package substrate through the first and second molds.

14. A method of fabricating a semiconductor package, the method comprising:
- preparing a first package substrate on which a lower semiconductor chip is mounted;
- preparing a second package substrate on which first and second upper semiconductor chips are mounted, the second package substrate having first and second surfaces, which are opposite to each other and define a recess region and a protruding portion, respectively, and having a chip region overlapped with the lower semiconductor chip and a connection region adjacent to the chip region; and
- mounting the second package substrate on the first package substrate in such a way that the lower semiconductor chip faces the recess region,
- wherein the first and second upper semiconductor chips are mounted on opposite edges of the second surface of the second package substrate and spaced apart from each other to have portions protruding toward the connection region beyond the chip region of the second package substrate,
- wherein each of the first and second upper semiconductor chips extends beyond the respective edge of the second surface, and
- wherein the second package substrate comprises a first insulating layer, a core layer, and a second insulating layer stacked sequentially.

* * * * *